(12) United States Patent
Muramoto

(10) Patent No.: US 11,443,972 B2
(45) Date of Patent: Sep. 13, 2022

(54) SUBSTRATE PROCESSING APPARATUS

(71) Applicant: SCREEN Holdings Co., Ltd., Kyoto (JP)

(72) Inventor: Ryo Muramoto, Kyoto (JP)

(73) Assignee: SCREEN Holdings Co., Ltd.

( * ) Notice: Subject to any disclaimer, the term of this patent is extended or adjusted under 35 U.S.C. 154(b) by 900 days.

(21) Appl. No.: 15/450,458

(22) Filed: Mar. 6, 2017

(65) Prior Publication Data
US 2017/0263491 A1    Sep. 14, 2017

(30) Foreign Application Priority Data

Mar. 9, 2016 (JP) .............................. JP2016-045827

(51) Int. Cl.
*H01L 21/687* (2006.01)
*H01L 21/677* (2006.01)
*H01L 21/67* (2006.01)

(52) U.S. Cl.
CPC .. *H01L 21/68707* (2013.01); *H01L 21/67023* (2013.01); *H01L 21/6773* (2013.01); *H01L 21/67161* (2013.01); *H01L 21/67167* (2013.01); *H01L 21/67173* (2013.01); *H01L 21/67178* (2013.01); *H01L 21/67184* (2013.01); *H01L 21/67712* (2013.01); *H01L 21/67742* (2013.01); *H01L 21/67748* (2013.01); *H01L 21/67751* (2013.01)

(58) Field of Classification Search
None
See application file for complete search history.

(56) References Cited

U.S. PATENT DOCUMENTS

| | | | |
|---|---|---|---|
| 6,402,400 B1 | 6/2002 | Ueda et al. | ..................... 396/611 |
| 2001/0013161 A1* | 8/2001 | Kitano | .............. H01L 21/67778 |
| | | | 29/25.01 |
| 2002/0092615 A1 | 7/2002 | Iida | ........................... 156/345.31 |
| 2002/0150459 A1* | 10/2002 | Fujii | ................. H01L 21/68707 |
| | | | 414/744.5 |

(Continued)

FOREIGN PATENT DOCUMENTS

| | | |
|---|---|---|
| CN | 101673665 A | 3/2010 |
| JP | 10-335415 A | 12/1998 |

(Continued)

*Primary Examiner* — Karla A Moore
(74) *Attorney, Agent, or Firm* — Ostrolenk Faber LLP

(57) ABSTRACT

A transfer path is provided which is extended so as to be passed on a lateral side of a processing portion that processes a substrate. The substrate transferred between a container held by a holding unit and the processing portion passes through the transfer path. A first transfer robot carries the substrate into and out of the container held by the holding unit, and accesses a reception/delivery region arranged within the transfer path. A second transfer robot receives and delivers the substrate from and to the first transfer robot in the reception/delivery region, and carries the substrate into and out of the processing portion. A second transfer robot raising/lowering unit which raises and lowers the second transfer robot is arranged within the transfer path. The reception/delivery region and the second transfer robot raising/lowering unit are located between the first transfer robot and the second transfer robot.

12 Claims, 11 Drawing Sheets

(56) References Cited

U.S. PATENT DOCUMENTS

| | | | |
|---|---|---|---|
| 2005/0027387 A1* | 2/2005 | Fujishima | H01L 21/67051 700/112 |
| 2007/0081881 A1* | 4/2007 | Okuno | H01L 21/67167 414/217 |
| 2008/0170931 A1* | 7/2008 | Hashimoto | H01L 21/68707 414/225.01 |
| 2008/0235926 A1 | 10/2008 | Machida | 29/25.01 |
| 2009/0053020 A1* | 2/2009 | Okuno | H01L 21/67196 414/222.01 |
| 2009/0252578 A1 | 10/2009 | Machida | 414/222.01 |
| 2010/0068014 A1 | 3/2010 | Mitsuyoshi et al. | 414/225.01 |
| 2010/0249993 A1 | 9/2010 | Mitsuyoshi | 700/228 |
| 2012/0201634 A1* | 8/2012 | Hiroki | H01L 21/67742 414/226.05 |
| 2013/0206185 A1 | 8/2013 | Mitsuyoshi et al. | 134/62 |
| 2013/0256267 A1* | 10/2013 | Ota | H01L 21/67207 216/62 |
| 2019/0013220 A1* | 1/2019 | Muramoto | H01L 21/67178 |
| 2019/0019706 A1* | 1/2019 | Takusari | H01L 21/67276 |

FOREIGN PATENT DOCUMENTS

| | | |
|---|---|---|
| JP | 2001-118782 A | 4/2001 |
| JP | 2002-217264 A | 8/2002 |
| JP | 2005-093 812 A | 4/2005 |
| JP | 2006128208 A * | 5/2006 |
| JP | 2006-332543 A | 12/2006 |
| JP | 2007-053203 A | 3/2007 |
| JP | 2007-095831 A | 4/2007 |
| JP | 2009-049232 A | 3/2009 |
| JP | 2010-238783 A | 10/2010 |
| JP | 2014-007279 A | 1/2014 |
| KR | 10-2007-0035424 A | 3/2007 |
| KR | 10-2008-0076787 A | 8/2008 |
| TW | 200849349 A1 | 12/2008 |
| TW | 201001602 A1 | 1/2010 |

* cited by examiner

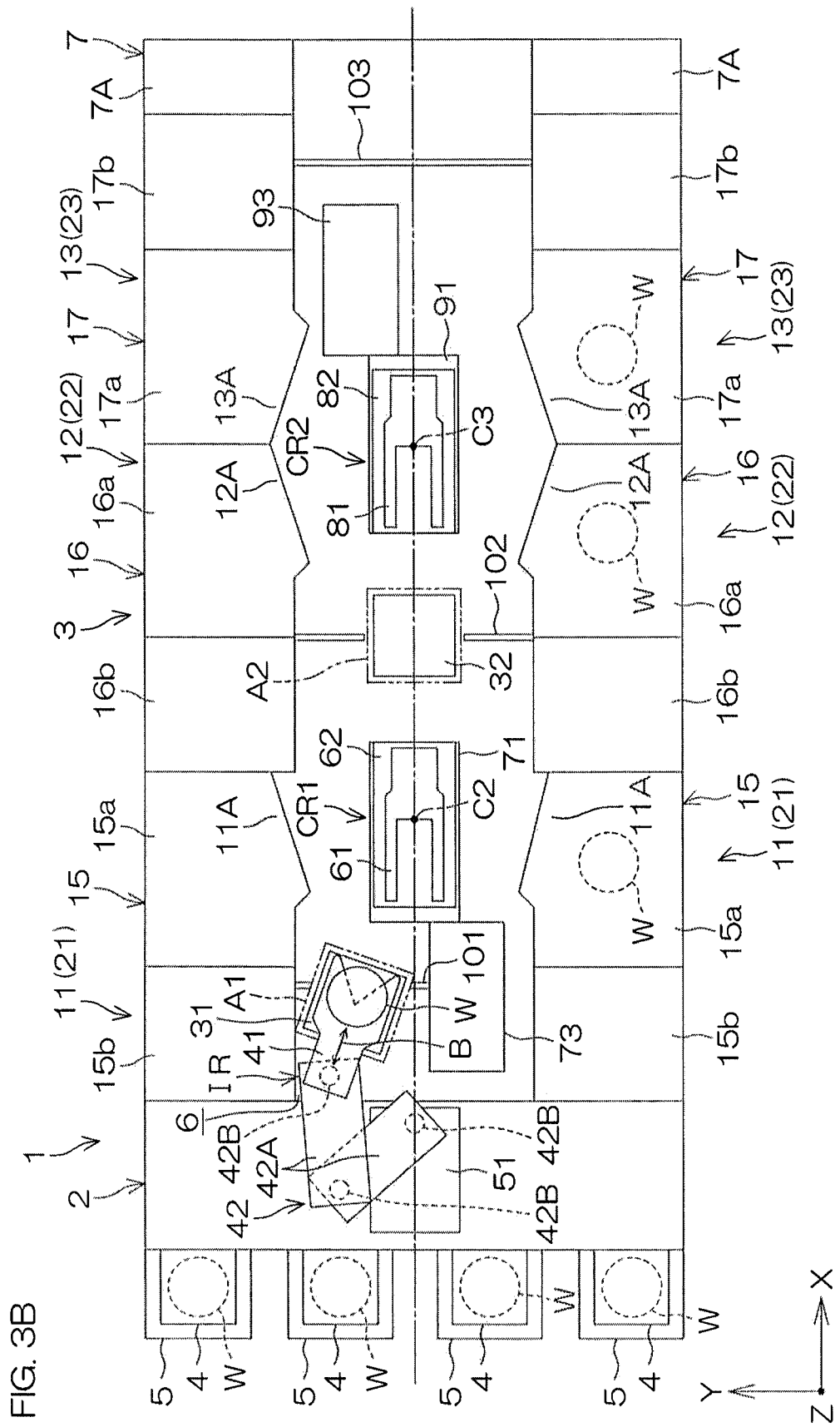

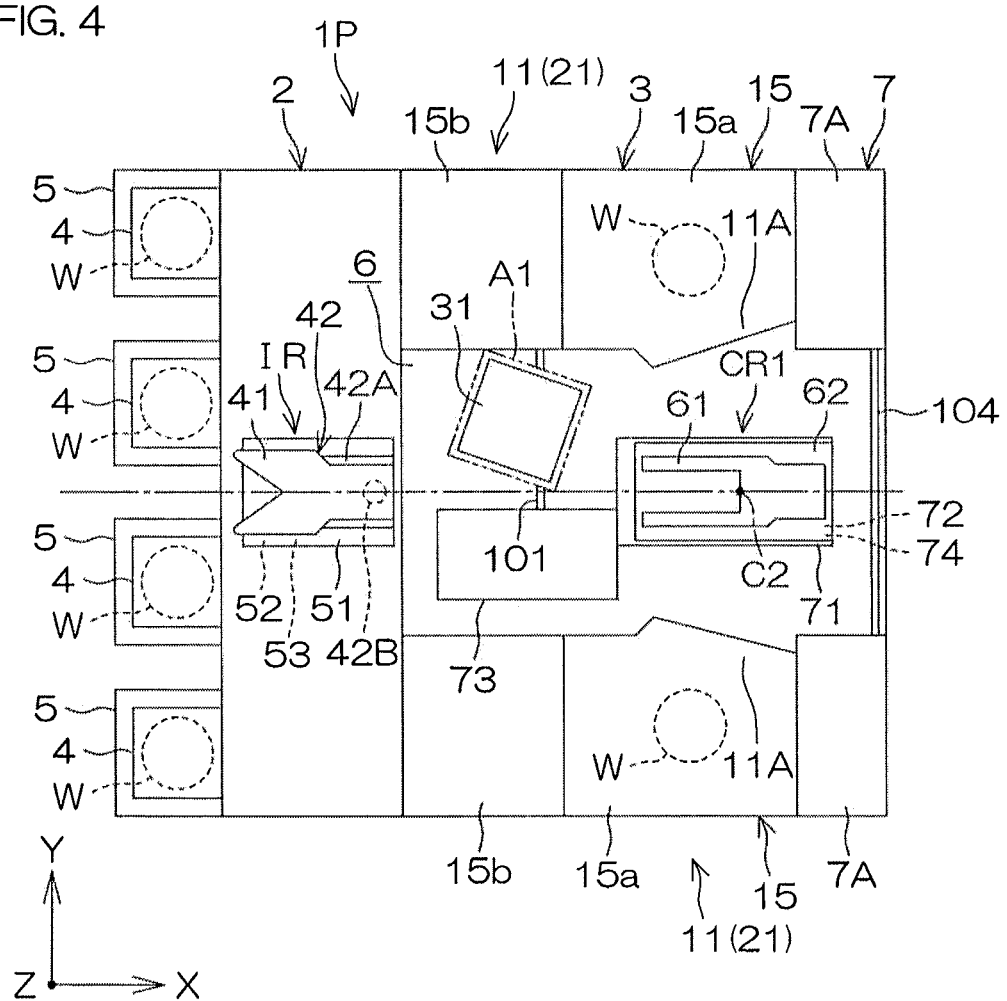

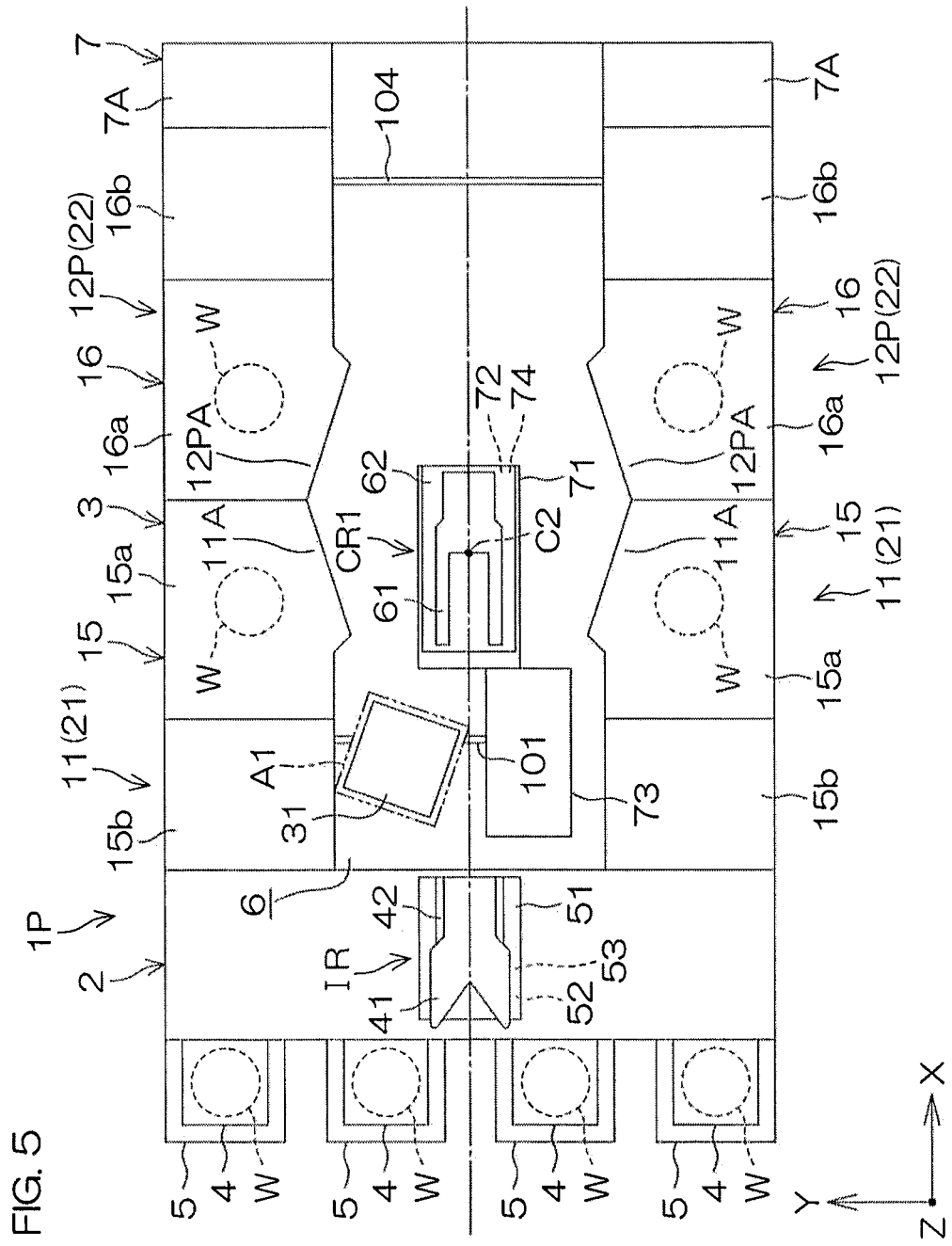

SUBSTRATE PROCESSING APPARATUS

BACKGROUND OF THE INVENTION

1. Field of the Invention

The present invention relates to a substrate processing apparatus that processes substrates. Examples of substrates to be processed include semiconductor wafers, substrates for liquid crystal display devices, substrates for plasma displays, substrates for FEDs (Field Emission Displays), substrates for optical disks, substrates for magnetic disks, substrates for magneto-optical disks, substrates for photomasks, ceramic substrates and substrates for solar cells.

2. Description of the Related Art

An example of a single substrate processing-type substrate processing apparatus which is used in the manufacturing process of a semiconductor device is disclosed in Japanese Patent Application Publication No. 2006-332543. The apparatus includes a carrier holding portion which holds a carrier that can be contained in a state where a plurality of substrates are stacked in layers, a processing portion which processes the substrate, a main transfer robot which carries the substrate into and out of the processing portion and an indexer robot which transfers the substrate between the carrier held in the carrier holding portion and the main transfer robot. In order for the substrate to be transferred between the carrier and a processing unit, the substrate is received and delivered between the indexer robot and the main transfer robot.

The substrate is received and delivered between the indexer robot and the main transfer robot through a shuttle transfer mechanism. The shuttle transfer mechanism reciprocates, along a transfer path extended from an area where the indexer robot is arranged, between the access position of the indexer robot and the access position of the main transfer robot. The indexer robot accesses the access position of the indexer robot to receive and deliver the substrate from and to the shuttle transfer mechanism. The main transfer robot accesses the access position of the main transfer robot to receive and deliver the substrate from and to the shuttle transfer mechanism.

The main transfer robot is raised and lowered by a raising/lowering drive mechanism. The raising/lowering drive mechanism moves the main transfer robot to such a height position that the substrate can be carried into and out of the processing unit included in the processing portion, and moves the main transfer robot to such a height position that the substrate is received and delivered from and to the shuttle transfer mechanism.

SUMMARY OF THE INVENTION

In the substrate processing apparatus disclosed in Japanese Patent Application Publication No. 2006-332543, as shown in FIG. 1 of the Publication, the raising/lowering drive mechanism is arranged on the side opposite to the indexer robot with respect to the main transfer robot. Hence, the shuttle transfer mechanism, the main transfer robot and the raising/lowering drive mechanism are arranged and aligned in this order within the transfer path so as to be located away from the indexer robot. Therefore, the size of the substrate processing apparatus is increased in the direction in which the transfer path is extended, and thus the footprint (the occupied area) of the substrate processing apparatus may be increased.

Hence, an object of the present invention is to provide a substrate processing apparatus in which its occupied area is reduced.

The invention provides a substrate processing apparatus including a holding unit which holds a container that contains a substrate, a processing portion which processes the substrate, a transfer path which is extended so as to be passed on a lateral side of the processing portion and through which the substrate transferred between the container held by the holding unit and the processing portion is passed, a first transfer robot which carries the substrate into and out of the container held by the holding unit and which accesses a reception/delivery region arranged within the transfer path, a second transfer robot which receives and delivers the substrate from and to the first transfer robot in the reception/delivery region and which carries the substrate into and out of the processing portion, and a second transfer robot raising/lowering unit which is arranged within the transfer path and which raises and lowers the second transfer robot. The reception/delivery region and the second transfer robot raising/lowering unit are located between the first transfer robot and the second transfer robot.

In this configuration, between the container held by the holding unit and the processing portion, the substrate is transferred by the first transfer robot and the second transfer robot. At that time, the substrate is passed through the transfer path which is extended so as to be passed on a lateral side of the processing portion. Within the transfer path, the reception/delivery region is arranged in which the substrate is received and delivered between the first transfer robot and the second transfer robot. Furthermore, within the transfer path, the second transfer robot raising/lowering unit is arranged, and the second transfer robot raising/lowering unit is located between the first transfer robot and the second transfer robot. In this way, as compared with a case where the second transfer robot raising/lowering unit is located on the side of the second transfer robot opposite to the first transfer robot, it is possible to shorten the necessary length of the transfer path. Hence, it is possible to reduce the size of the substrate processing apparatus and thus it is possible to reduce the occupied area of the substrate processing apparatus.

The processing portion includes at least one single substrate processing-type processing unit which processes the substrates one by one. The processing portion may include a plurality of single substrate processing-type processing units which are stacked in layers in an up/down direction.

In a preferred embodiment of the present invention, the transfer path is extended linearly from the holding unit toward the second transfer robot. The reception/delivery region and the second transfer robot raising/lowering unit are aligned in a direction intersecting a direction in which the transfer path is extended.

In this configuration, the reception/delivery region and the second transfer robot raising/lowering unit are aligned in the direction intersecting the direction in which the transfer path is extended linearly. Thus, it is possible to further shorten the necessary length of the transfer path.

In a preferred embodiment of the present invention, a direction in which the substrate is moved when the substrate is delivered from the first transfer robot to the second transfer robot is inclined with respect to the direction in which the transfer path is extended.

In this configuration, the direction in which the substrate is moved when the substrate is received and delivered between the first transfer robot and the second transfer robot is inclined with respect to the direction in which the transfer path is extended. Hence, the reception/delivery region and the second transfer robot raising/lowering unit are easily aligned in the direction in which the transfer path is extended. Thus, it is possible to easily perform a design in which the necessary length of the transfer path is still further shortened.

In a preferred embodiment of the present invention, the substrate processing apparatus further includes a placement unit which is arranged in the reception/delivery region and on which the substrate is placed so that the substrate is received and delivered between the first transfer robot and the second transfer robot.

In this configuration, on the placement unit arranged in the reception/delivery region, the substrate is placed when the substrate is received and delivered between the first transfer robot and the second transfer robot. Hence, it is not necessary to synchronize the timing at which the first transfer robot and the second transfer robot access the reception/delivery region in order to receive and deliver the substrate, and thus the degree of freedom of the operation of the first transfer robot and the second transfer robot is increased. Consequently, it is possible to enhance the transfer efficiency of the substrate by the first transfer robot and the second transfer robot.

In a preferred embodiment of the present invention, the placement unit is located, in an up/down direction, between the container held by the holding unit and the center of the processing portion in the up/down direction.

The transfer efficiency of the substrate by the first transfer robot is enhanced as the position (height) of the container in the up/down direction is closer to the position (height) of the placement unit in the up/down direction. On the other hand, the transfer efficiency of the substrate by the second transfer robot is enhanced as the center (height) of the processing portion in the up/down direction is closer to the position (height) of the placement unit in the up/down direction. The placement unit is located, in the up/down direction, between the container held by the holding unit and the center of the processing portion in the up/down direction, and thus the placement unit is easily accessed with efficiency both by the first transfer robot and the second transfer robot. Hence, it is possible to enhance the transfer efficiency of the substrate.

In a preferred embodiment of the present invention, the substrate processing apparatus further includes a first transfer robot raising/lowering unit which raises and lowers the first transfer robot in an up/down direction between a lower position opposite the holding unit and an upper position opposite the placement unit. The placement unit is located, in the up/down direction, in a center position between the lower position of the first transfer robot and the center (height) of the processing portion in the up/down direction.

In this configuration, the placement unit is located, in the up/down direction, in a center position between the lower position of the first transfer robot and the center of the processing portion in the up/down direction. Thus, it is possible to have a balance between the transfer efficiency of the substrate by the first transfer robot and the transfer efficiency of the substrate by the second transfer robot, with the result that it is possible to enhance the transfer efficiency as a whole.

In a preferred embodiment of the present invention, a pair of the processing portions are provided so as to be opposite each other across the transfer path. In this configuration, the pair of the processing portions are opposite each other across the transfer path, and thus it is possible to increase the number of processing portions without increasing the length of the transfer path.

In a preferred embodiment of the present invention, the processing portion includes an exit/entrance port through which the substrate is moved into and out of the processing portion on the side opposite to the side of the holding unit with respect to the center of the processing portion in a direction in which the transfer path is extended. The second transfer robot is arranged opposite the exit/entrance port of the processing portion.

In this configuration, the second transfer robot is opposite the exit/entrance port on the side opposite to the side of the holding unit with respect to the center of the processing portion in the direction in which the transfer path is extended. Hence, when a processing portion is additionally provided on the side of the processing portion opposite to the side of the holding unit, it is possible to easily make the second transfer robot access the processing portion additionally provided. Thus, it is possible to increase the number of processing portions in the direction in which the transfer path is extended without increasing the number of transfer robots for transferring the substrate. For example, it is possible to adopt a configuration in which the second transfer robot carries the substrate into and out of all of the two processing portions arranged in the direction in which the transfer path is extended. Consequently, it is possible to reduce the size and cost of the substrate processing apparatus as compared with a case where the number of transfer robots is increased.

In a preferred embodiment of the present invention, the three or more processing portions are arranged in a direction in which the transfer path is extended. A close processing portion arranged closest to the holding unit includes an exit/entrance port through which the substrate is moved into and out of the close processing portion on the side opposite to the side of the holding unit with respect to the center of the close processing portion in the direction in which the transfer path is extended. A remote processing portion arranged farthest from the holding unit includes an exit/entrance port through which the substrate is moved into and out of the remote processing portion on the side of the holding unit with respect to the center of the remote processing portion in the direction in which the transfer path is extended.

In this configuration, the close processing portion includes the exit/entrance port on the side opposite to the side of the holding unit with respect to the center of the close processing portion in the direction in which the transfer path is extended. The remote processing portion includes the exit/entrance port on the side of the holding unit with respect to the center of the remote processing portion in the direction in which the transfer path is extended. Hence, the transfer robot is arranged between each of the pairs of processing portions arranged adjacently in the direction in which the transfer path is extended, and thus any one of the transfer robots can access all of the processing portions. Therefore, since it is not necessary to provide the transfer robot in a position away from the holding unit further than the remote processing portion, it is possible to reduce the size and cost of the substrate processing apparatus.

In a preferred embodiment of the present invention, the substrate processing apparatus further includes a cover which shields an atmosphere around the reception/delivery region and an atmosphere around the processing portion from each other. The cover is attached to the second transfer robot raising/lowering unit.

In this configuration, the atmosphere around the reception/delivery region and the atmosphere around the processing portion are shielded from each other with the cover attached to the second transfer robot raising/lowering unit. Hence, for example, even when the atmosphere of a processing fluid used for processing the substrate within the processing portion is present in the atmosphere around the processing portion, it is possible to reduce or prevent the contamination of the first transfer robot which accesses the reception/delivery region by the atmosphere.

Furthermore, since the second transfer robot raising/lowering unit is located together with the reception/delivery region between the first transfer robot and the second transfer robot, the second transfer robot raising/lowering unit is located relatively close to the reception/delivery region. Hence, the cover can be attached to the second transfer robot raising/lowering unit. Moreover, since part of the transfer path is shielded with the second transfer robot raising/lowering unit, the cover is attached to the second transfer robot raising/lowering unit, and thus it is possible to reduce the size of the cover.

The aforementioned or other objects, features and effects of the present invention will be clarified by the description of preferred embodiments to be described below with reference to accompanying drawings.

BRIEF DESCRIPTION OF THE DRAWINGS

FIGS. 3A to 3F are schematic plan views for illustrating the transfer operation of a substrate by a transfer robot included in the substrate processing apparatus.

FIG. 4 is a schematic plan view for illustrating the layout of the interior of a substrate processing apparatus according to a second preferred embodiment of the present invention.

FIG. 5 is a schematic plan view for illustrating a layout when a processing portion is additionally provided in the substrate processing apparatus according to the second preferred embodiment.

DETAILED DESCRIPTION OF THE PREFERRED EMBODIMENTS

First Preferred Embodiment

Figure 1:
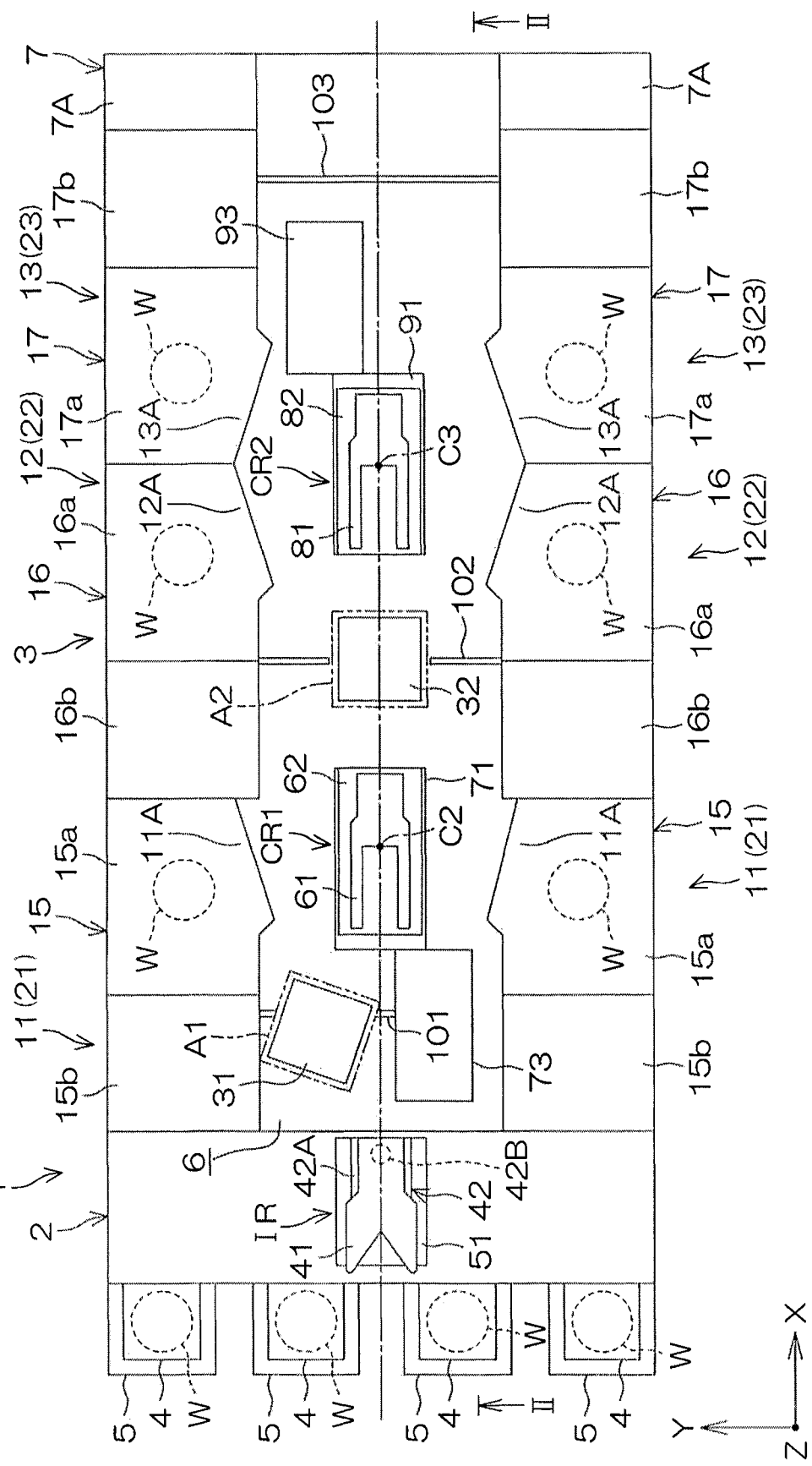
FIG. 1 is a schematic plan view for illustrating the layout of the interior of a substrate processing apparatus according to a first preferred embodiment of the present invention.
Figure 2:
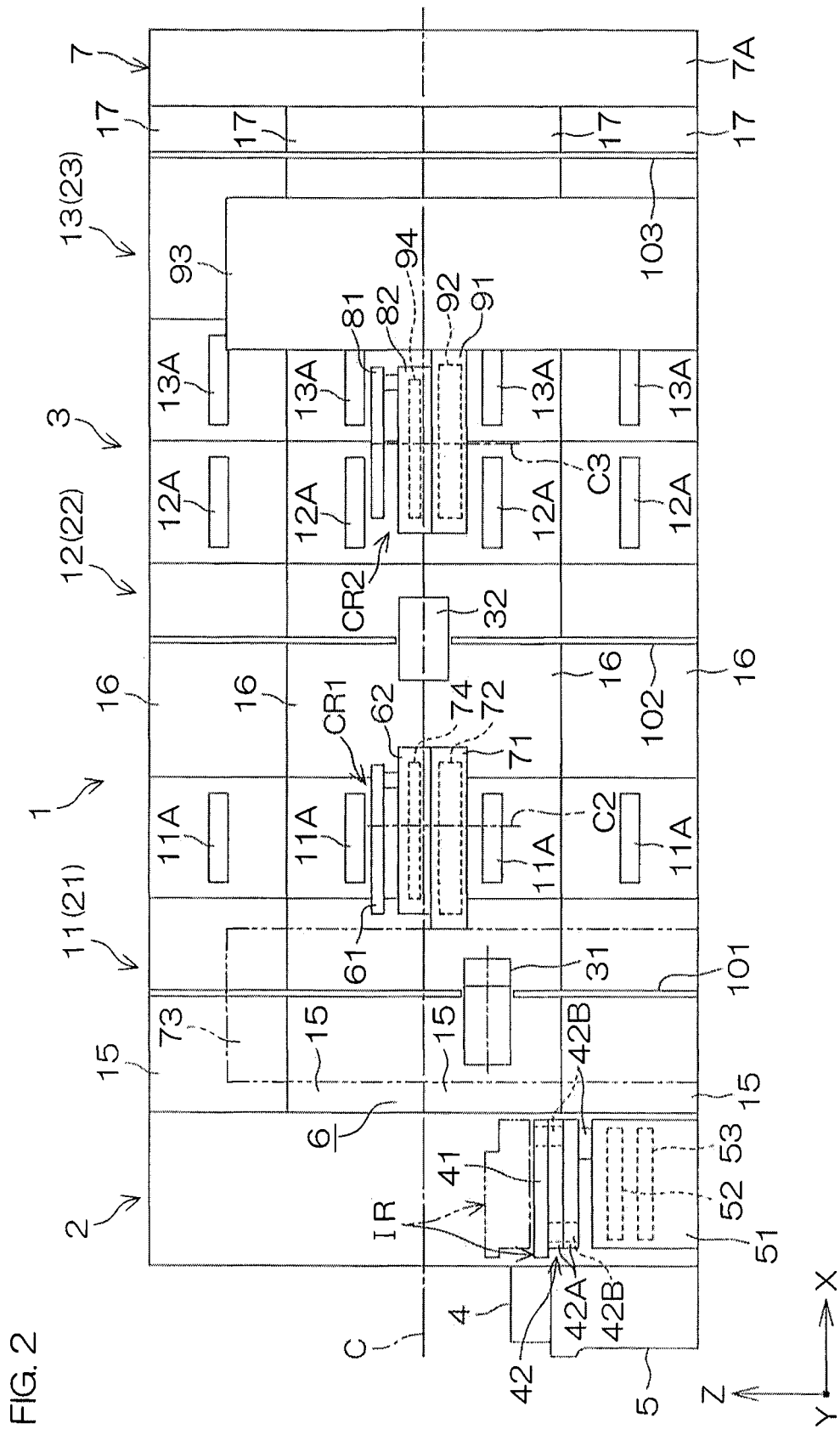
FIG. 2 is a schematic vertical cross-sectional view taken along line II-II of FIG. 1.

FIG. 1 is a schematic plan view for illustrating the layout of the interior of a substrate processing apparatus 1 according to a first preferred embodiment of the present invention. FIG. 2 is a schematic vertical cross-sectional view taken along line II-II of FIG. 1.

The substrate processing apparatus 1 is a single substrate processing-type apparatus which performs various types of processing such as cleaning processing and etching processing on substrates W such as semiconductor wafers one by one. The substrate processing apparatus 1 includes an indexer section 2 which holds an unprocessed substrate W and a processed substrate W, a processing section 3 which processes the substrate W and a power supply section 7 which supplies power to the indexer section 2 and the processing section 3. The indexer section 2, the processing section 3 and the power supply section 7 are aligned along a horizontal direction. The indexer section 2 is adjacent to the processing section 3. The power supply section 7 is adjacent to the processing section 3 from the side opposite to the indexer section 2.

The indexer section 2 includes a holding unit 5 on which a container 4 that contains the substrate W is placed and which holds the container 4 and an indexer robot IR which carries the substrate W into and out of the container 4 on the holding unit 5. The container 4 is also called a carrier. The container 4 is, for example, arranged such that a plurality of substrates W in a horizontal posture are held while stacked in layers a distance apart in an up/down direction. For example, a plurality of holding units 5 are provided so as to be aligned in parallel, and one container 4 can be held by each of the holding units 5. The indexer robot IR is arranged substantially in the center of the indexer section 2 in a direction in which the holding units 5 are aligned. The indexer robot IR rotates, expands and contracts an indexer hand 41 which will be described later, and thereby can access all the holding units 5 in the indexer section 2. The indexer robot IR is an example of a first transfer robot.

The processing section 3 includes a first processing block 21, a second processing block 22 and a third processing block 23. The second processing block 22 is adjacent to the first processing block 21 from the side opposite to the indexer section 2. The third processing block 23 is adjacent to the second processing block 22 from the side opposite to the first processing block 21.

The first processing block 21 includes a pair of first processing portions 11 which respectively perform various types of processing such as cleaning processing and etching processing on the substrate W. The second processing block 22 includes a pair of second processing portions 12 which respectively perform various types of processing such as cleaning processing and etching processing on the substrate W. The third processing block 23 includes a pair of third processing portions 13 which respectively perform various types of processing such as cleaning processing and etching processing on the substrate W.

Each of the first processing portions 11 includes a plurality of (for example, four) first processing units 15 which are stacked in layers in the up/down direction. Each of the second processing portions 12 includes a plurality of (for example, four) second processing units 16 which are stacked in layers in the up/down direction. Each of the third processing portions 13 includes a plurality of (for example, four) third processing units 17 which are stacked in layers in the up/down direction. The processing units 15 to 17 are single substrate processing-type processing units which process the substrates W one by one.

The processing section 3 further includes a first main transfer robot CR1 which receives and delivers the substrate W from and to the indexer robot IR and which carries the substrate W into and out of the first processing portions 11. The processing section 3 further includes a second main transfer robot CR2 which receives and delivers the substrate W from and to the first main transfer robot CR1 and which carries the substrate W into and out of the second processing portions 12 and the third processing portions 13.

The first main transfer robot CR1 is an example of a second transfer robot, and the second main transfer robot CR2 is an example of a third transfer robot. The indexer robot IR, the first main transfer robot CR1 and the second main transfer robot CR2 are aligned substantially in a straight line in plan view.

The substrate processing apparatus 1 further includes a transfer path 6 which is extended in the horizontal direction. The transfer path 6 is extended, for example, linearly from the indexer section 2 toward the first main transfer robot CR1. In the following description, the direction in which the transfer path 6 is extended is referred to as an "X direction." The X direction is also a direction which is perpendicular to the direction in which the holding units 5 are aligned. A horizontal direction perpendicular to the X direction is referred to as a "Y direction," and an up/down direction perpendicular to the X direction and the Y direction is referred to as a "Z direction."

The second processing portions 12 are arranged on the side of the first processing portions 11 opposite to the holding units 5 in the X direction. The third processing portions 13 are arranged on the side of the second processing portions 12 opposite to the holding units 5 in the X direction. In other words, the first processing portions 11 are close processing portions which are arranged closest to the holding units 5, and the third processing portions 13 are remote processing portions which are arranged farthest from the holding units 5. The first processing portions 11, the second processing portions 12 and the third processing portions 13 are aligned in this order in a direction away from the holding units 5. The first main transfer robot CR1 is located in the vicinity of a boundary between the first processing portions 11 and the second processing portions 12 in the X direction. The second main transfer robot CR2 is located in the vicinity of a boundary between the second processing portions 12 and the third processing portions 13 in the X direction. The transfer path 6 is extended, in plan view, from the holding units 5 so as to be passed through to the same lateral side of the first processing portions 11, the second processing portions 12 and the third processing portions 13.

The pair of first processing portions 11 are provided symmetrically with respect to the transfer path 6. Each of the first processing units 15 of the first processing portions 11 has a longitudinal shape in the X direction. Each of the first processing units 15 includes a first processing chamber 15a which contains the substrate W in order to process the substrate W with a processing liquid and a fluid box 15b which contains pipes for supplying a fluid such as the processing liquid used within the first processing chamber 15a in order to process the substrate W. The first processing chamber 15a is arranged on the side of the fluid box 15b opposite to the holding units 5 in the X direction. The first processing chamber 15a may be adjacent to the fluid box 15b.

The first processing portion 11 has, in a portion on the side opposite to the side of the holding unit 5 and on the side facing the transfer path 6, a first exit/entrance port 11A through which the substrate W is moved in and out. Specifically, the first exit/entrance port 11A is an opening through which the substrate W is moved into and out of the first processing chamber 15a of the first processing portion 11, and is provided in each of the first processing units 15. The first exit/entrance port 11A is provided in a portion on the side opposite to the side of the holding unit 5 with respect to the center of the first processing portion 11 in the X direction. The first exit/entrance port 11A may be provided at an end portion of the first processing portion 11 on the side opposite to the side of the holding unit 5 in the X direction. In the first exit/entrance port 11A, an openable shutter (not shown) may be provided.

The pair of second processing portions 12 are provided symmetrically with respect to the transfer path 6. Each of the second processing units 16 of the second processing portions 12 has a longitudinal shape in the X direction. Each of the second processing units 16 includes a second processing chamber 16a which contains the substrate W in order to process the substrate W with the processing liquid and a fluid box 16b which contains pipes for supplying a fluid such as the processing liquid used within the second processing chamber 16a in order to process the substrate W. The second processing chamber 16a is arranged on the side of the fluid box 16b opposite to the holding units 5 in the X direction.

The second processing portion 12 has, in the portion on the side opposite to the side of the holding unit 5 and on the side facing the transfer path 6, a second exit/entrance port 12A through which the substrate W is moved in and out. Specifically, the second exit/entrance port 12A is an opening through which the substrate W is moved into and out of the second processing chamber 16a of the second processing portion 12, and is provided in each of the second processing units 16. The second exit/entrance port 12A is provided in a portion on the side opposite to the side of the holding unit 5 with respect to the center of the second processing portions 12 in the X direction. The second exit/entrance port 12A may be provided at an end portion of the second processing portion 12 on the side opposite to the side of the holding unit 5 in the X direction. In the second exit/entrance port 12A, an openable shutter (not shown) may be provided.

The pair of third processing portions 13 are provided symmetrically with respect to the transfer path 6. Each of the third processing units 17 of the third processing portions 13 has a longitudinal shape in the X direction. Each of the third processing units 17 includes a third processing chamber 17a which contains the substrate W in order to process the substrate W with the processing liquid and a fluid box 17b which contains pipes for supplying a fluid such as the processing liquid used within the third processing chamber 17a in order to process the substrate W. The third processing chamber 17a is arranged on the side of the fluid box 17b opposite to the holding units 5 in the X direction.

The third processing portion 13 has, in a portion on the side of the holding unit 5 and on the side facing the transfer path 6, a third exit/entrance port 13A through which the substrate W is moved in and out. Specifically, the third exit/entrance port 13A is an opening through which the substrate W is moved into and out of the third processing chamber 17a of the third processing portion 13, and is provided in each of the third processing units 17. The third exit/entrance port 13A is provided in a portion on the side of the holding unit 5 with respect to the center of the third processing portions 13 in the X direction. The third exit/entrance port 13A may be provided at an end portion of the third processing portion 13 on the side of the holding unit 5 in the X direction. In the third exit/entrance port 13A, an openable shutter (not shown) may be provided.

The power supply section 7 includes a pair of breaker units 7A. The breaker units 7A are arranged on the side opposite to the holding units 5 through the third processing portions 13. Unlike the present preferred embodiment, a configuration may be adopted in which only one of the pair of breaker units 7A is provided.

The substrate processing apparatus 1 further includes a first placement unit 31 on which the substrate W is placed so that the substrate W is received and delivered between the indexer robot IR and the first main transfer robot CR1 and a second placement unit 32 on which the substrate W is placed so that the substrate W is received and delivered between the first main transfer robot CR1 and the second main transfer robot CR2.

The first placement unit 31 is arranged in a reception/delivery region A1. The reception/delivery region A1 is a region which is previously set within the transfer path 6, and is located between the indexer robot IR and the first main transfer robot CR1. The substrate W is received and delivered in the reception/delivery region A1 between the indexer robot IR and the first main transfer robot CR1.

The second placement unit 32 is arranged in a reception/delivery region A2. The reception/delivery region A2 is a region which is previously set within the transfer path 6, and is located between the first main transfer robot CR1 and the second main transfer robot CR2. The substrate W is received and delivered in the reception/delivery region A2 between the first main transfer robot CR1 and the second main transfer robot CR2.

The indexer robot IR is a horizontal articulated robot. The indexer robot IR includes the indexer hand 41 which can hold the substrate W and an indexer arm 42 in which the indexer hand 41 is attached to its tip end. The tip end of the indexer hand 41 is formed in the shape of, for example, a fork. The indexer arm 42 includes a plurality of (for example, two) links 42A. In the indexer arm 42, the link 42A on the most tip end side and the indexer hand 41 are connected with another joint 42B, and the links 42A are connected to each other with a joint 42B. The indexer hand 41 and the links 42A are individually and independently rotated about the joints 42B.

The indexer section 2 further includes a support member 51 which supports the indexer robot IR, a movement unit 52 which independently rotates the indexer hand 41 and the links 42A about the joints 42B to move the indexer hand 41 and an indexer robot raising/lowering unit 53 which raises and lowers the indexer robot IR. The movement unit 52 and the indexer robot raising/lowering unit 53 are incorporated in, for example, the support member 51. The indexer robot raising/lowering unit 53 is an example of a first transfer robot raising/lowering unit which raises and lowers the indexer robot IR serving as the first transfer robot.

The indexer robot raising/lowering unit 53 raises and lowers the indexer robot IR in the Z direction between a lower position (position shown by solid lines in FIG. 2) at which the indexer hand 41 of the indexer robot IR is opposite the lower end of the container 4 held by the holding unit 5 in the horizontal direction and an upper position (position indicated by chain double-dashed lines in FIG. 2) at which the indexer hand 41 is opposite the first placement unit 31 in the horizontal direction.

The first placement unit 31 is located in the Z direction between the container 4 held by the holding unit 5 and a center C of the first processing portions 11 in the Z direction. Specifically, the first placement unit 31 is located, in the Z direction, in a center position between the lower position of the indexer robot IR and the center C. More specifically, a portion (for example, the center of the first placement unit 31 in the Z direction) of the first placement unit 31 on which the substrate W is placed is located, in the Z direction, at least between the container 4 held by the holding unit 5 and the center C of the first processing portions 11 in the Z direction. The portion of the first placement unit 31 on which the substrate W is placed is located in the center position between the lower position of the indexer robot IR and the center C.

The center C of the first processing portions 11 is determined based on the positions, in the Z direction, of the exit/entrance ports 11A of the first processing units 15 stacked in layers. Specifically, the center C is a center position between the position of the uppermost first exit/entrance port 11A in the Z direction and the position of the lowermost first exit/entrance port 11A in the Z direction. The center C is also the center of the second processing portions 12 and the third processing portions 13 in the Z direction. The second placement unit 32 is arranged such that a portion (for example, the center of the second placement unit 32 in the Z direction) of the second placement unit 32 on which the substrate W is placed coincides with the center C.

The indexer robot IR can make the indexer hand 41 opposite the container 4 held by the holding unit 5 in the horizontal direction. In this state, the indexer robot IR accesses the container 4 and thereby can carry the substrate W into and out of the container 4.

The indexer robot IR can make the indexer hand 41 opposite the first placement unit 31 in the horizontal direction. In this state, the indexer robot IR accesses the reception/delivery region A1 and thereby can place the substrate W on the first placement unit 31 and receive the substrate W placed on the first placement unit 31.

The processing section 3 includes the first main transfer robot CR1 and a first main transfer robot raising/lowering unit 73 which raises and lowers the first main transfer robot CR1 in the Z direction. The first main transfer robot raising/lowering unit 73 is an example of a second transfer robot raising/lowering unit which raises and lowers the first main transfer robot CR1 serving as the second transfer robot. In FIG. 2, for convenience of description, the first main transfer robot raising/lowering unit 73 is indicated by chain double-dashed lines.

The first main transfer robot CR1 includes a first main transfer hand 61 which can hold the substrate W, a holding portion 62 which holds the first main transfer hand 61 such that the first main transfer hand 61 can be linearly advanced and retracted and a support member 71 which rotatably supports the holding portion 62. The tip end of the first main transfer hand 61 is formed in the shape of, for example, a fork. In the holding portion 62, a first main transfer hand advance/retraction unit 74 which advances and retracts the first main transfer hand 61 in the horizontal direction is incorporated. In the support member 71, a first main transfer robot pivoting unit 72 which rotates the holding portion 62 around a vertical axis C2 is incorporated.

The first main transfer hand 61 can be moved by the first main transfer hand advance/retraction unit 74 between a retraction position where the entire first main transfer hand 61 is located on the holding portion 62 in plan view and an advance position where the tip end thereof is linearly advanced most externally from the holding portion 62 so as to be moved away from the holding portion 62.

The holding portion 62 can be rotated around the vertical axis C2 on the support member 71 by the first main transfer robot pivoting unit 72.

The first main transfer robot raising/lowering unit 73 is arranged within the transfer path 6. The first main transfer robot raising/lowering unit 73 is located between the indexer robot IR and the first main transfer robot CR1. The reception/delivery region A1 and the first main transfer robot raising/lowering unit 73 are aligned in plan view in a direction intersecting the X direction. Specifically, the reception/delivery region A1 and the first main transfer robot raising/lowering unit 73 are adjacent in the Y direction. The center of the reception/delivery region A1 in plan view and the center of the first main transfer robot raising/lowering unit 73 in plan view may be aligned in the Y direction.

Unlike the present preferred embodiment, the center of the reception/delivery region A1 in plan view and the center of the first main transfer robot raising/lowering unit 73 in plan view may be aligned in the horizontal direction other than the X direction and the Y direction. The horizontal direction other than the X direction and the Y direction is a direction which intersects the X direction, for example, a direction which is inclined with respect to both the X direction and the Y direction.

Figure 2A:
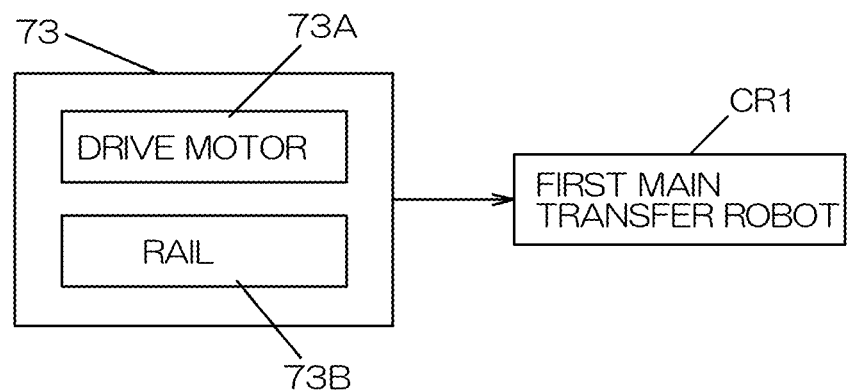
FIG. 2A is a schematic view showing a first main transfer robot raising/lowering unit coupled to a first main transfer robot.

The first main transfer robot raising/lowering unit 73 is coupled to the first main transfer robot CR1 in the support member 71. The first main transfer robot raising/lowering unit 73 raises and lowers the support member 71 in the Z direction to raise and lower the first main transfer robot CR1 in the Z direction. As shown in FIG. 2A, the first main transfer robot raising/lowering unit 73 includes a drive motor 73A which drives the raising and lowering of the support member 71 in the Z direction and a rail 73B which guides the raising and lowering of the support member 71 in the Z direction.

The first main transfer robot raising/lowering unit 73 drives the raising and lowering of the first main transfer robot CR1, and thus the first main transfer robot CR1 is raised and lowered between a lower position opposite the lowermost first exit/entrance port 11A of the first processing unit 15 in the horizontal direction and an upper position opposite the uppermost first exit/entrance port 11A of the first processing unit 15 in the horizontal direction. In a predetermined position between the lower position and the upper position, the first main transfer robot CR1 is opposite the first exit/entrance port 11A of the first processing unit 15 arranged between the uppermost first processing unit 15 and the lowermost first processing unit 15. As described above, the first main transfer robot CR1 is arranged opposite the first exit/entrance port 11A.

The first main transfer robot CR1 can make the first main transfer hand 61 opposite the first exit/entrance port 11A of the first processing unit 15 in the horizontal direction. In this state, the first main transfer robot CR1 accesses the first processing unit 15 through the first exit/entrance port 11A, and thereby can carry the substrate W into and out of the first processing unit 15.

The first main transfer robot CR1 can make the first main transfer hand 61 opposite the first placement unit 31 in the horizontal direction. In this state, the first main transfer robot CR1 accesses the first placement unit 31 and thereby can place the substrate W on the first placement unit 31 and receive the substrate W placed on the first placement unit 31.

The first main transfer robot CR1 is preferably arranged such that a distance between a position where the substrate W is placed within the first processing chamber 15a of the first processing unit 15 and the first main transfer robot CR1, a distance between a position where the substrate W is placed in the first placement unit 31 and the first main transfer robot CR1 and a distance between a position where the substrate W is placed in the second placement unit 32 and the first main transfer robot CR1 are equal to each other in plan view.

The processing section 3 includes the second main transfer robot CR2 and a second main transfer robot raising/lowering unit 93 which raises and lowers the second main transfer robot CR2 in the Z direction. The second main transfer robot raising/lowering unit 93 is an example of a third transfer robot raising/lowering unit which raises and lowers the second main transfer robot CR2 serving as the third transfer robot.

The second main transfer robot CR2 includes a second main transfer hand 81 which can hold the substrate W, a holding portion 82 which holds the second main transfer hand 81 such that the second main transfer hand 81 can be linearly advanced and retracted and a support member 91 which rotatably supports the holding portion 82. The tip end of the second main transfer hand 81 is formed in the shape of, for example, a fork. In the holding portion 82, a second main transfer hand advance/retraction unit 94 which advances and retracts the second main transfer hand 81 in the horizontal direction is incorporated. In the support member 91, a second main transfer robot pivoting unit 92 which rotates the holding portion 82 around a vertical axis C3 is incorporated.

The second main transfer hand 81 can be moved by the second main transfer hand advance/retraction unit 94 between a retraction position where the entire second main transfer hand 81 is located on the holding portion 82 in plan view and an advance position where the tip end thereof is linearly advanced most externally from the holding portion 82 so as to be moved away from the holding portion 82.

The holding portion 82 can be rotated around the vertical axis C3 on the support member 91 by the second main transfer robot pivoting unit 92.

Figure 2B:
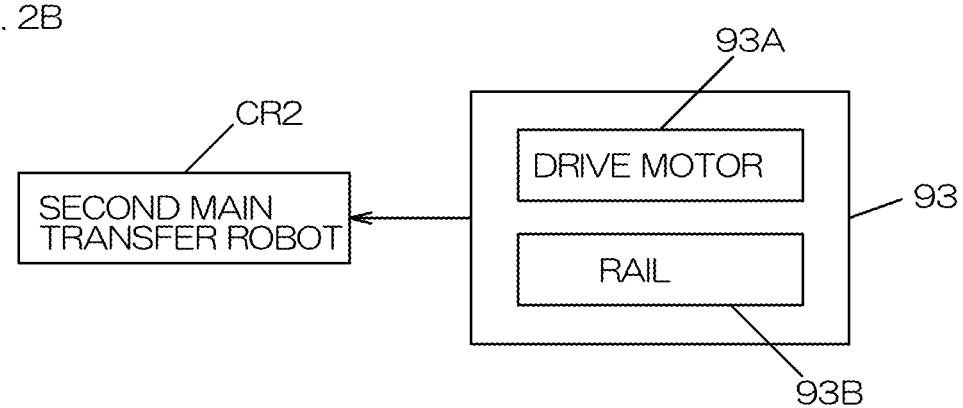
FIG. 2B is a schematic view showing a second main transfer robot raising/lowering unit coupled to a second main transfer robot.

The second main transfer robot raising/lowering unit 93 is located on the side of the second main transfer robot CR2 opposite to the holding units 5. The second main transfer robot raising/lowering unit 93 is coupled to the second main transfer robot CR2 in the support member 91. The second main transfer robot raising/lowering unit 93 raises and lowers the support member 91 to raise and lower the second main transfer robot CR2 in the Z direction. As shown in FIG. 2B, the second main transfer robot raising/lowering unit 93 includes a drive motor 93A which drives the raising and lowering of the support member 91 in the Z direction and a rail 93B which guides the raising and lowering of the support member 91 in the Z direction.

The second main transfer robot raising/lowering unit 93 drives the raising and lowering of the second main transfer robot CR2, and thus the second main transfer robot CR2 is raised and lowered between a lower position opposite the lowermost second exit/entrance port 12A of the second processing unit 16 in the horizontal direction and an upper position opposite the uppermost second exit/entrance port 12A of the second processing unit 16 in the horizontal direction. In a predetermined position between the lower position and the upper position, the second main transfer robot CR2 is opposite the second exit/entrance port 12A of the second processing unit 16 between the uppermost second processing unit 16 and the lowermost second processing units 16.

When the second main transfer robot CR2 is in the lower position, the second main transfer robot CR2 is also opposite the lowermost third exit/entrance port 13A of the third processing unit 17 in the horizontal direction. When the second main transfer robot CR2 is in the upper position, the second main transfer robot CR2 is also opposite the uppermost third exit/entrance port 13A of the third processing unit 17 in the horizontal direction. In a predetermined position between the lower position and the upper position, the second main transfer robot CR2 is opposite the third exit/entrance port 13A of the third processing unit 17 between the uppermost third processing unit 17 and the lowermost third processing unit 17. As described above, the second main transfer robot CR2 is arranged opposite the second exit/entrance port 12A and the third exit/entrance port 13A.

The second main transfer robot CR2 can make the second main transfer hand 81 opposite the second exit/entrance port 12A of the second processing units 16 in the horizontal direction. In this state, the second main transfer robot CR2 accesses the second processing unit 16 through the second exit/entrance port 12A, and thereby can carry the substrate W into and out of the second processing unit 16.

The second main transfer robot CR2 can make the second main transfer hand 81 opposite the third exit/entrance port 13A of the third processing unit 17 in the horizontal direction. In this state, the second main transfer robot CR2 accesses the third processing unit 17 through the third exit/entrance port 13A, and thereby can carry the substrate W into and out of the third processing unit 17.

The second main transfer robot CR2 is pivoted by the second main transfer robot pivoting unit 92 and is raised and lowered by the second main transfer robot raising/lowering unit 93, and thus the second main transfer robot CR2 makes the second main transfer hand 81 opposite the second placement unit 32 in the X direction. In this state, the second main transfer robot CR2 accesses the second placement unit 32 and thereby can place the substrate W on the second placement unit 32 and receive the substrate W placed on the second placement unit 32.

The second main transfer robot CR2 is preferably arranged such that a distance between a position where the substrate W is placed within the second processing chamber 16a of the second processing unit 16 and the second main transfer robot CR2, a distance between a position where the substrate W is placed within the third processing chamber 17a of the third processing unit 17 and the second main transfer robot CR2 and a distance between a position where the substrate W is placed in the second placement unit 32 and the second main transfer robot CR2 are equal to each other in plan view.

The substrate processing apparatus 1 further includes a first cover 101 which shields an atmosphere around the reception/delivery region A1 and an atmosphere around the first processing portions 11 from each other, a second cover 102 which shields the atmosphere around the first processing portions 11 and an atmosphere around the second processing portions 12 from each other, and a third cover 103 which shields an atmosphere around the third processing portions 13 and an atmosphere outside the substrate processing apparatus 1 from each other. One side surface of the first cover 101 is attached to the first processing unit 15, and the other side surface is attached to the first main transfer robot raising/lowering unit 73. The first cover 101 is divided into an upper portion and a lower portion. The upper portion of the first cover 101 is located above the first placement unit 31, and the lower portion of the first cover 101 is located below the first placement unit 31. Hence, the first main transfer robot CR1 can receive and deliver the substrate W from and to the first placement unit 31 without being obstructed by the first cover 101.

One side surface of the second cover 102 is attached to the second processing unit 16, and the other side surface is attached to the second processing unit 16 on the opposite side across the transfer path 6. The second cover 102 is divided into an upper portion and a lower portion. The upper portion of the second cover 102 is located above the second placement unit 32. The lower portion of the second cover 102 is located below the second placement unit 32. Hence, the second main transfer robot CR2 can receive and deliver the substrate W from and to the second placement unit 32 without being obstructed by the second cover 102.

The transfer operation of the substrate W by the indexer robot IR, the first main transfer robot CR1 and the second main transfer robot CR2 will then be described.

FIGS. 3A to 3F are schematic plan views for illustrating the transfer operation of the substrate W by the indexer robot IR, the first main transfer robot CR1 and the second main transfer robot CR2. In a state shown in FIG. 3A, in the processing units which are arranged on the upper side of the plane of the figure with respect to the transfer path 6 among the processing units 15 to 17, the substrate W is not contained.

For clarification, in FIGS. 3A to 3F, the substrates W which are placed on the first placement unit 31 and the second placement unit 32 are indicated by solid lines. Moreover, for clarification, in FIGS. 3A to 3F, the indexer hand 41, the first main transfer hand 61 and the second main transfer hand 81 which access the first placement unit 31 and the second placement unit 32 are shown by solid lines. However, the portions of the indexer hand 41, the first main transfer hand 61 and the second main transfer hand 81 which are located below the substrate W are indicated by broken lines.

Figure 3A:
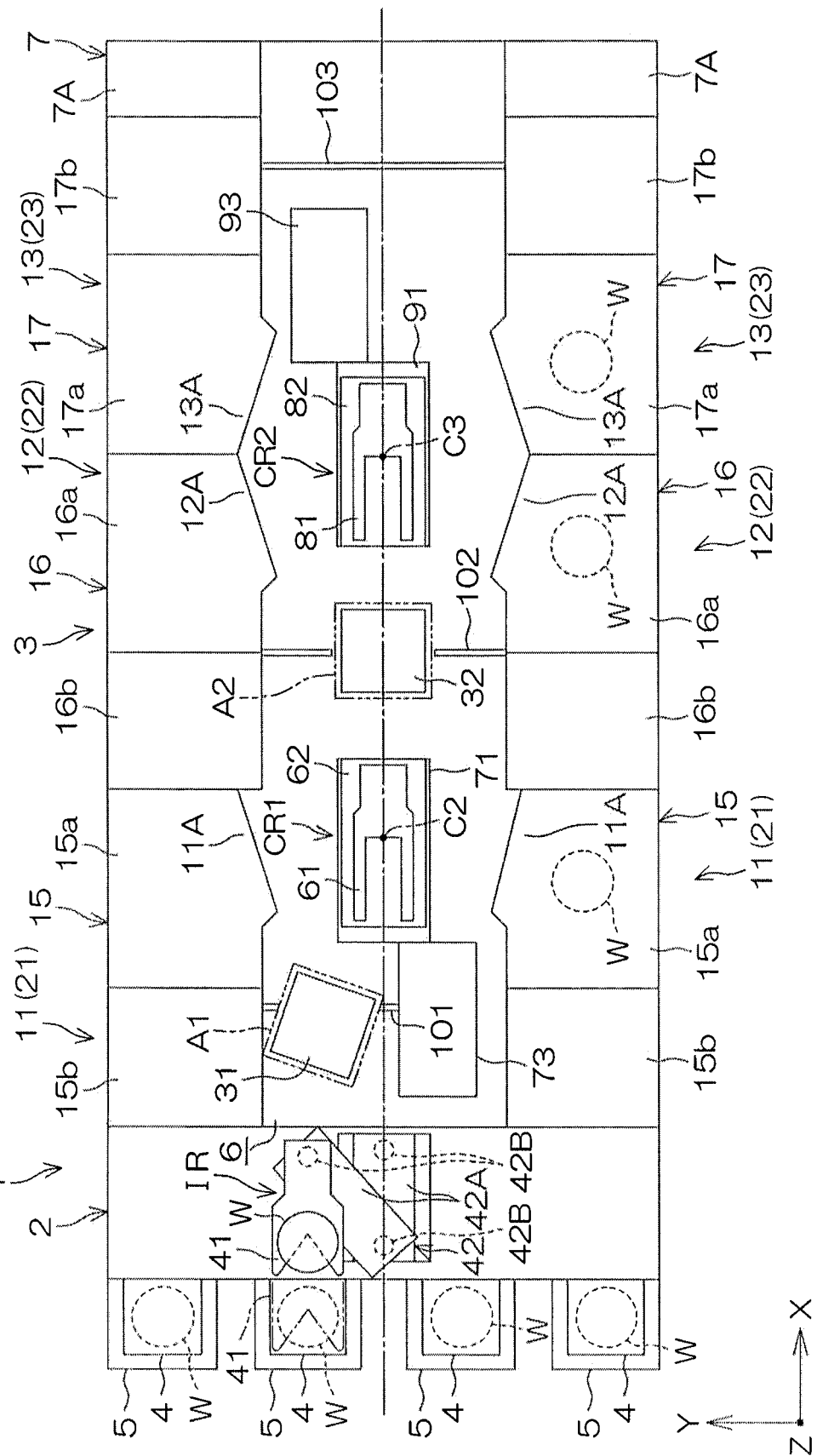

The indexer robot IR is first moved by the indexer robot raising/lowering unit 53 into the lower position. As shown in FIG. 3A, the indexer hand 41 is moved by the movement unit 52 such that the indexer hand 41 can access the container 4 of any of the holding units 5 (for example, the second holding unit 5 from the upper portion of the plane of FIG. 3A). In this way, as indicated by chain double-dashed lines in FIG. 3A, the indexer robot IR receives an unprocessed substrate W (a substrate before processing) from the container 4. Then, the indexer hand 41 is moved by the movement unit 52 so as to be retracted from the container 4.

Thereafter, the indexer robot IR is moved by the indexer robot raising/lowering unit 53 into the upper position. As shown in FIG. 3B, the indexer hand 41 of the indexer robot IR is moved by the movement unit 52 in a direction B inclined with respect to the X direction so as to access the first placement unit 31 arranged in the reception/delivery region A1. In this way, the unprocessed substrate W is placed on the first placement unit 31. Here, the substrate W held by the indexer hand 41 is also moved in the direction B inclined with respect to the X direction. The direction B is the horizontal direction and is inclined with respect to the X direction in plan view.

Figure 3C:
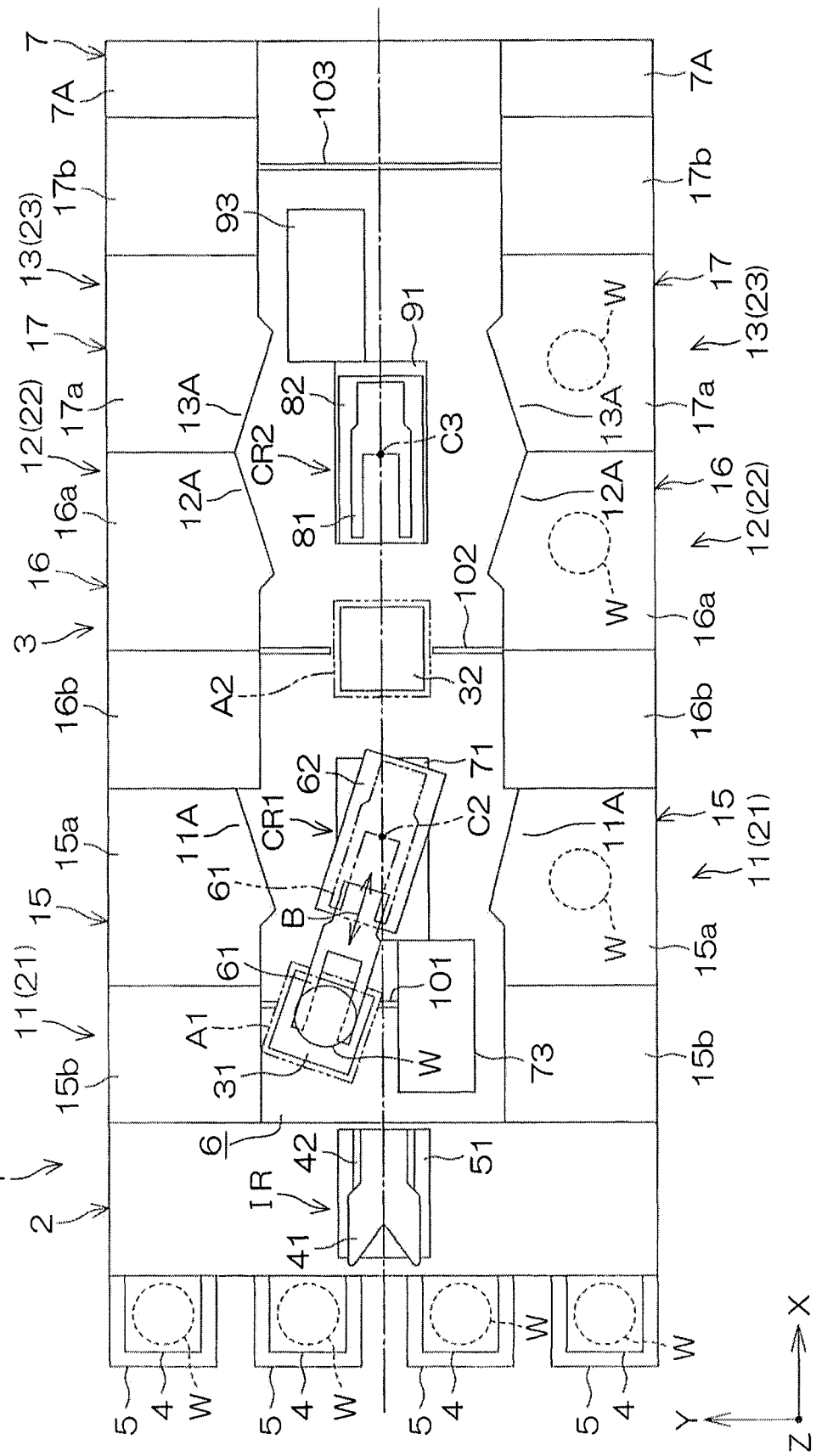

Then, the first main transfer robot CR1 is moved by the first main transfer robot pivoting unit 72 and the first main transfer robot raising/lowering unit 73 into a position (position indicated by chain double-dashed lines in FIG. 3C) at which the first main transfer hand 61 is opposite the first placement unit 31. In a state where the first main transfer hand 61 is opposite the first placement unit 31, the first main transfer hand 61 is linearly moved by the first main transfer hand advance/retraction unit 74 in the direction B toward the advance position. As shown in FIG. 3C, the first main transfer hand 61 accesses the first placement unit 31 at a position between the retraction position and the advance position so as to receive the unprocessed substrate W from the first placement unit 31.

Thereafter, the first main transfer hand 61 is linearly moved by the first main transfer hand advance/retraction unit 74 in the direction B so as to be positioned at the retraction position, and is returned to the position indicated by chain double-dashed lines in FIG. 3C. Here, the substrate W held by the first main transfer hand 61 is also moved in the direction B. As described above, the unprocessed substrate W is delivered through the first placement unit 31 from the indexer robot IR to the first main transfer robot CR1. The first main transfer robot CR1 having received the unprocessed substrate W is moved by the first main transfer robot pivoting unit 72 and the first main transfer robot raising/lowering unit 73 into a position (see FIG. 3D) at which the first main transfer hand 61 is opposite the first exit/entrance port 11A of the first processing unit 15 or a position (see FIG. 3E) at which the first main transfer hand 61 is opposite the second placement unit 32.

Figure 3D:
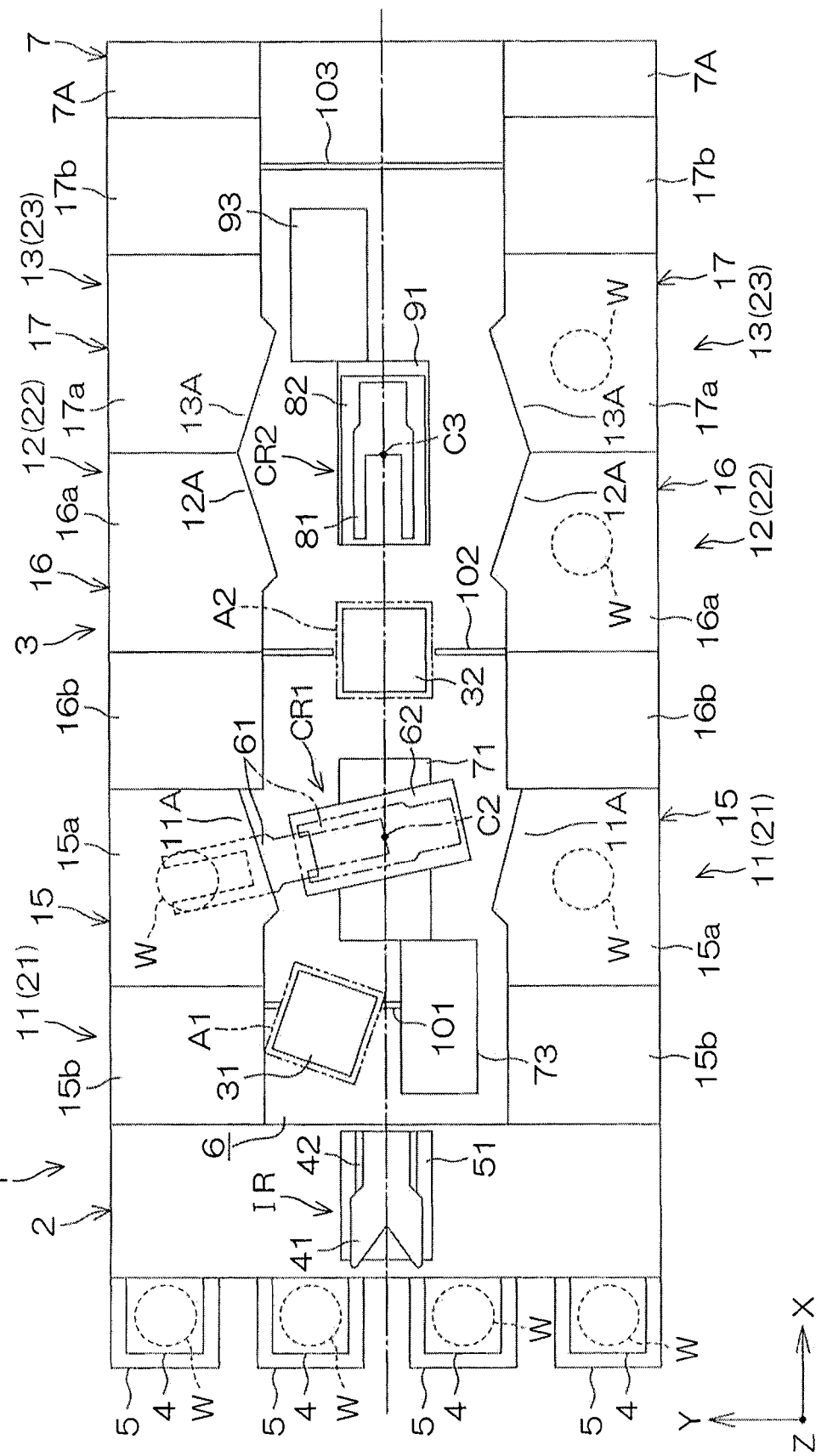

With reference to FIG. 3D, when the unprocessed substrate W is processed in the first processing unit 15, in a state where the first main transfer hand 61 is opposite the first exit/entrance port 11A of the first processing unit 15, the first main transfer hand 61 is linearly moved by the first main transfer hand advance/retraction unit 74 so as to be positioned at the advance position. In this way, the first main transfer hand 61 accesses the first processing unit 15 at a position between the retraction position and the advance position so as to place the substrate W into the first processing chamber 15a. Thereafter, the first main transfer hand 61 is linearly moved by the first main transfer hand advance/retraction unit 74 so as to be positioned at the retraction position. As described above, the unprocessed substrate W is transferred between the container 4 held by the holding unit 5 and the first processing unit 15. Thereafter, the substrate W is processed by the first processing unit 15 for a predetermined time, and is then received by the first main transfer robot CR1.

Figure 3E:
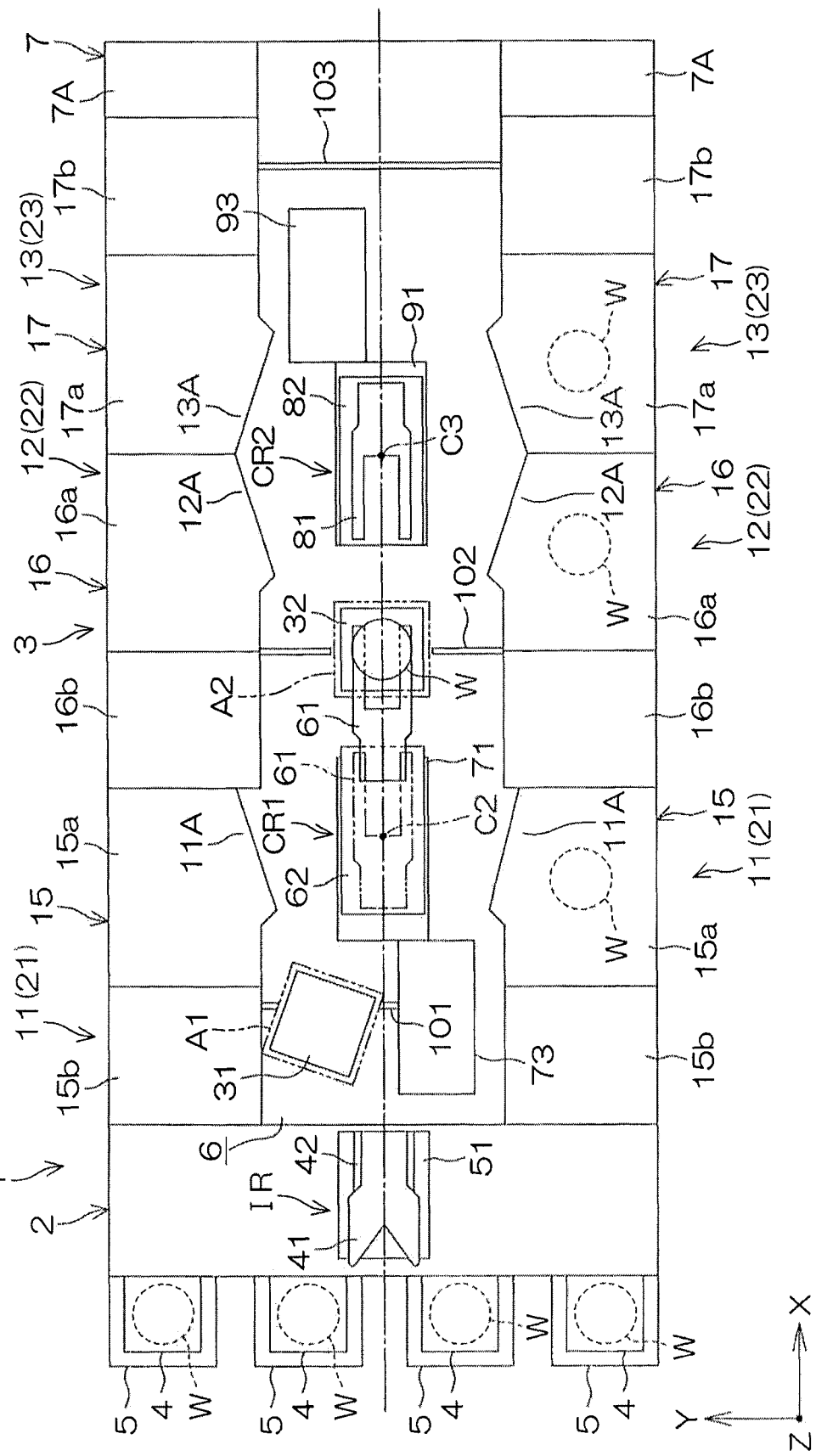

When the unprocessed substrate W is processed by the second processing unit 16 or the third processing unit 17, with reference to FIG. 3E, in a state where the first main transfer hand 61 is opposite the second placement unit 32, the first main transfer hand 61 is linearly moved by the first main transfer hand advance/retraction unit 74 so as to be positioned at the advance position. In this way, the first main transfer hand 61 accesses the second placement unit 32 at a position between the retraction position and the advance position so as to place the unprocessed substrate W on the second placement unit 32.

Figure 3F:
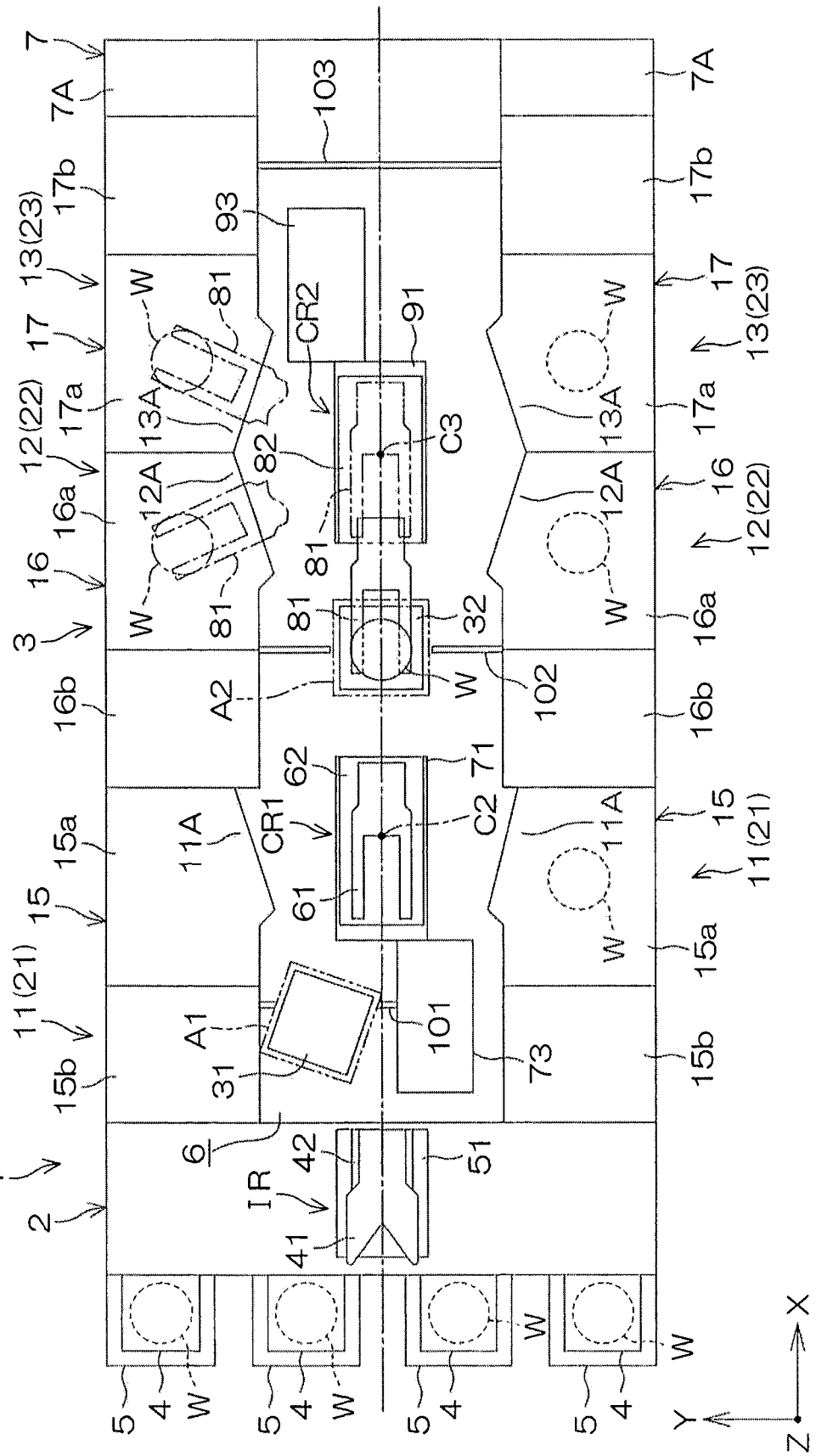

Then, with reference to FIG. 3F, the second main transfer robot CR2 is moved by the second main transfer robot pivoting unit 92 and the second main transfer robot raising/lowering unit 93 into a position at which the second main transfer hand 81 is opposite the second placement unit 32. In a state where the second main transfer hand 81 is opposite the second placement unit 32, the second main transfer hand 81 is linearly moved in the X direction by the second main transfer hand advance/retraction unit 94 so as to be positioned at the advance position. The second main transfer hand 81 accesses the second placement unit 32 at a position between the retraction position and the advance position so as to receive the unprocessed substrate W from the second placement unit 32. In this way, the unprocessed substrate W is delivered through the second placement unit 32 to the second main transfer robot CR2.

Thereafter, the second main transfer hand 81 is linearly moved in the X direction by the second main transfer hand advance/retraction unit 94 so as to be positioned at the retraction position. The second main transfer robot CR2 having received the unprocessed substrate W is moved by the second main transfer robot pivoting unit 92 and the second main transfer robot raising/lowering unit 93 into a position at which the second main transfer hand 81 is opposite the second exit/entrance port 12A of the second processing unit 16 or in a position in which the second main transfer hand 81 is opposite the third exit/entrance port 13A of the third processing unit 17.

In a state where the second main transfer hand 81 is opposite the second exit/entrance port 12A of the second processing unit 16 or the third exit/entrance port 13A of the third processing unit 17, the second main transfer hand 81 is linearly moved by the second main transfer hand advance/retraction unit 94 so as to be positioned at the advance position. In this way, the second main transfer hand 81 accesses the second processing unit 16 or the third processing unit 17 at a position between the retraction position and the advance position so as to place the substrate W into the second processing chamber 16a or the third processing chamber 17a (see chain single-dashed lines in FIG. 3F). Thereafter, the second main transfer hand 81 is linearly moved by the second main transfer hand advance/retraction unit 94 so as to be positioned at the retraction position. As described above, the unprocessed substrate W is transferred between the container 4 held by the holding unit 5 and the second processing unit 16 or the third processing unit 17.

The substrate W processed for a predetermined time in the second processing unit 16 or the third processing unit 17 is received by the second main transfer robot CR2 and is delivered through the second placement unit 32 from the second main transfer robot CR2 to the first main transfer robot CR1.

The substrate W processed by the processing portions 11 to 13 is placed by the first main transfer robot CR1 on the first placement unit 31. Specifically, the first main transfer robot CR1 is moved by the first main transfer robot pivoting unit 72 and the first main transfer robot raising/lowering unit 73 into a position at which the first main transfer hand 61 is opposite the first placement unit 31. In a state where the first main transfer hand 61 is opposite the first placement unit 31, the first main transfer hand 61 is linearly moved in the direction B inclined with respect to the X direction so as to be positioned at the advance position. Here, the substrate W held in the first main transfer hand 61 is also moved in the direction B. At a position between the retraction position and the advance position, the first main transfer hand 61 accesses the first placement unit 31 so as to place the processed substrate W on the first placement unit 31.

Then, the indexer robot IR is moved by the indexer robot raising/lowering unit 53 into the upper position. The indexer hand 41 is moved by the movement unit 52 such that the indexer hand 41 can access the first placement unit 31. In this way, the indexer hand 41 receives the processed substrate W. The indexer hand 41 is moved by the movement unit 52 in the direction B so as to be retracted from the first placement unit 31. Here, the substrate W held in the first main transfer hand 61 is also moved in the direction B. In this way, the processed substrate W is delivered through the first placement unit 31 from the first main transfer robot CR1 to the indexer robot IR. Then, the processed substrate W is contained by the indexer robot IR into the container 4 held by the holding unit 5. As described above, the processed substrate W is transferred between the first processing unit 15, the second processing unit 16 or the third processing unit 17 and the container 4 held by the holding unit 5.

In the present preferred embodiment, between the container 4 held by the holding unit 5 and the processing portions 11 to 13, the substrate W is transferred by the indexer robot IR and the first main transfer robot CR1. At that time, the substrate W is passed through the transfer path 6 which is extended so as to be passed on a lateral side of the first processing portions 11. Within the transfer path 6, the reception/delivery region A1 is set in which the substrate W is received and delivered between the indexer robot IR and the first main transfer robot CR1. Furthermore, within the transfer path 6, the first main transfer robot raising/lowering unit 73 is arranged, and the first main transfer robot raising/lowering unit 73 is located between the indexer robot IR and the first main transfer robot CR1. In this way, as compared with a case where the first main transfer robot raising/lowering unit 73 is located on the side of the first main transfer robot CR1 opposite to the indexer robot IR, it is possible to shorten the length of the transfer path necessary for the transfer of the substrate W to the first processing unit 15 of the first processing portions 11. Hence, it is possible to reduce the size of the substrate processing apparatus 1 and thus it is possible to reduce the occupied area of the substrate processing apparatus 1.

Since the reception/delivery region A1 and the first main transfer robot raising/lowering unit 73 are aligned in a direction (for example, the Y direction) intersecting the X direction (direction in which the linear transfer path 6 is extended), it is possible to further shorten the length of the transfer path necessary for transferring the substrate W to the first processing unit 15 of the first processing portion 11.

Since the direction B in which the substrate W is moved when the substrate W is received and delivered between the indexer robot IR and the first main transfer robot CR1 is inclined with respect to the X direction in plan view, the reception/delivery region A1 and the first main transfer robot raising/lowering unit 73 are easily aligned in the direction intersecting the X direction. Hence, it is possible to easily perform a design in which the length of the transfer path necessary for transferring the substrate W to the first processing unit 15 of the first processing portion 11 is still further shortened.

Since the first placement unit 31 and the first main transfer robot raising/lowering unit 73 are aligned in the direction (for example, the Y direction) intersecting the X direction, the first processing portion 13 and the first main transfer robot raising/lowering unit 73 can be arranged within the transfer path 6 without the length of the transfer path 6 from the indexer robot IR to the first main transfer robot CR1 being increased. Thus, it is possible to reduce the size of the substrate processing apparatus 1 and to enhance the transfer efficiency of the substrate W.

On the first placement unit 31 arranged in the reception/delivery region A1, the substrate W is placed so that the substrate W is received and delivered between the indexer robot IR and the first main transfer robot CR1. Hence, it is not necessary to synchronize the timing at which the indexer robot IR and the first main transfer robot CR1 access the reception/delivery region A1 in order to receive and deliver the substrate W. Thus, the degree of freedom of the operation of the indexer robot IR and the first main transfer robot CR1 is increased. Consequently, it is possible to enhance the transfer efficiency of the substrate W by the indexer robot IR and the first main transfer robot CR1.

The transfer efficiency of the substrate W by the indexer robot IR is enhanced as the position of the container 4 in the Z direction is closer to the position of the first placement unit 31 in the Z direction. On the other hand, the transfer efficiency of the substrate W by the first main transfer robot CR1 is enhanced as the position of the center C of the first processing portion 11 in the Z direction is closer to the position of the first placement unit 31 in the Z direction. Since the first placement unit 31 is located in the Z direction between the container 4 held by the holding unit 5 and the center C of the first processing portion 11 in the Z direction, the first placement unit 31 is easily accessed with efficiency both by the indexer robot IR and the first main transfer robot CR1. Hence, it is possible to enhance the transfer efficiency of the substrate W.

The first placement unit 31 is located in the Z direction in a center position between the lower position of the indexer robot IR and the center C of the first processing portion 11 in the Z direction. Thus, it is possible to have a balance between the transfer efficiency of the substrate W by the indexer robot IR and the transfer efficiency of the substrate W by the first main transfer robot CR1, with the result that it is possible to enhance the transfer efficiency as a whole.

Since the pairs of processing portions 11 to 13 are opposite each other across the transfer path 6, it is possible to increase the number of processing portions 11 to 13 without increasing the length of the transfer path 6.

The atmosphere around the reception/delivery region A1 and the atmosphere around the first processing portion 11 are shielded from each other by the first cover 101 attached to the first main transfer robot raising/lowering unit 73. Hence, for example, even when the atmosphere of a processing fluid used for processing the substrate W within the first processing portion 11 is present in the atmosphere around the first processing portion 11, it is possible to reduce or prevent the contamination of the indexer robot IR (in particular, the indexer hand 41) which accesses the reception/delivery region A1 by vapor of the processing liquid.

Furthermore, since the first main transfer robot raising/lowering unit 73 is located together with the reception/delivery region A1 between the indexer robot IR and the first main transfer robot CR1, the first main transfer robot raising/lowering unit 73 is located relatively close to the reception/delivery region A1. Hence, the first cover 101 can be attached to the first main transfer robot raising/lowering unit 73. Moreover, since part of the transfer path 6 is shielded with the first main transfer robot raising/lowering unit 73, the first cover 101 is attached to the first main transfer robot raising/lowering unit 73, and thus it is possible to reduce the size of the first cover 101.

The first processing portion 11 which is the close processing portion includes the first exit/entrance port 11A on the side opposite to the side of the holding unit 5 with respect to the center of the first processing portion 11 in the X direction. The third processing portion 13 which is the remote processing portion includes the third exit/entrance port 13A on the side of the holding units 5 with respect to the third processing portion 13 in the X direction.

Hence, the first main transfer robot CR1 is arranged between the first processing portions 11 and the second processing portions 12, the second main transfer robot CR2 is arranged between the second processing portions 12 and the third processing portions 13, and thus either one of the transfer robots CR1 and CR2 can access all of the processing portions 11 to 13. Thus, it is not necessary to provide the transfer robot in a position away from the holding unit 5 further than the third processing portion 13 (remote processing portion). Therefore, in the configuration in which the three processing portions 11 to 13 are aligned in the X direction, it is not necessary to provide the transfer robot in a position away from the holding unit 5 further than the third processing portion 13. Consequently, it is possible to reduce the size and cost of the substrate processing apparatus 1.

Unlike the first preferred embodiment, four or more processing portions may be arranged in the X direction. Even in this case, with a configuration in which the close processing portion includes the exit/entrance port on the side opposite to the side of the holding units 5 with respect to the center of the close processing portion in the X direction, and in which the remote processing portion includes the exit/entrance port on the side of the holding units 5 with respect to the center of the remote processing portion in the X direction, it is not necessary to provide the transfer robot in a position away from the holding unit 5 further than with the remote processing portion. Consequently, it is possible to reduce the size of the substrate processing apparatus 1.

A second preferred embodiment will then be described.

Second Preferred Embodiment

FIG. 4 is a schematic plan view for illustrating the layout of the interior of a substrate processing apparatus 1P according to the second preferred embodiment. In FIG. 4 and FIG. 5 which will be described later, the corresponding members as those described previously are identified with the same reference signs, and the description thereof will be omitted.

The substrate processing apparatus 1P according to the second preferred embodiment differs from the substrate processing apparatus 1 according to the first preferred embodiment in that the substrate processing apparatus 1P does not include the second placement unit 32 and that the processing section 3 of the substrate processing apparatus 1P does not include the second processing portions 12, the third processing portions 13 and the second main transfer robot CR2. Hence, the power supply section 7 is adjacent to the first processing portion 11 of the substrate processing apparatus 1P from the side opposite to the indexer section 2. The substrate processing apparatus 1P further includes a cover 104 which shields the atmosphere around the first processing portion 11 and an atmosphere outside the substrate processing apparatus 1P from each other.

In the substrate processing apparatus 1P of the second preferred embodiment, as in the substrate processing apparatus 1 of the first preferred embodiment, the first processing portion 11 includes the first exit/entrance port 11A on the side opposite to the side of the holding units 5 with respect to the center of the first processing portion 11 in the X direction, and the first main transfer robot CR1 is arranged opposite the first exit/entrance port 11A. Hence, when a processing portion is additionally provided on the side of the first processing portion 11 opposite to the side of the holding units 5, it is possible to easily make the first main transfer robot CR1 access the processing portion additionally provided. Thus, it is possible to increase the number of processing portions in the X direction without increasing the number of transfer robots for transferring the substrate W. Consequently, it is possible to reduce the size and cost of the substrate processing apparatus 1P as compared with a case where the number of transfer robots is increased.

With reference to FIG. 5 for illustrating a layout when a processing portion is additionally provided to the substrate processing apparatus 1P, a second processing portion 12P is arranged between the first processing portion 11 and the power supply section 7 so that the two processing portions 11 and 12P are aligned in the X direction, and thus the first main transfer robot CR1 can carry the substrate W into and out of all the processing portions 11 and 12P. The second exit/entrance port 12PA of the second processing portion 12P is preferably located on the side of the holding units 5 with respect to the center of the second processing portion 12P. The second processing chamber 16a of the second processing unit 16 in the second processing portion 12P is preferably arranged on the side of the holding units 5 with respect to a fluid box 16b. In this case, as compared with the case where the second processing portion 12 is additionally provided in the first preferred embodiment, the first main transfer robot CR1 can easily access the second processing portion 12P.

Of course, without the second processing portion 12P being additionally provided to the substrate processing apparatus 1P later, the substrate processing apparatus 1P may originally include the processing portions 11 and 12P.

The second processing portion 12 and the third processing portion 13 are additionally provided between the first processing portion 11 of the substrate processing apparatus 1P and the power supply section 7, the second main transfer robot CR2 that is opposite the second processing portion 12 and the third processing portion 13 is additionally provided, and thereby the substrate processing apparatus 1 according to the first preferred embodiment can also be achieved.

In the second preferred embodiment, the same effects as in the first preferred embodiment are produced.

The present invention is not limited to the preferred embodiments described above, and the present invention can be practiced with yet other preferred embodiments.

For example, the indexer robot IR may be arranged to directly receive and deliver the substrate W from and to the first main transfer robot CR1. In this case, the reception and delivery of the substrate W is performed in the reception/delivery region A1. In this case, the substrate processing apparatus 1 or 1P does not need to include the first placement unit 31.

When the substrate W is directly received and delivered between the indexer robot IR and the first main transfer robot CR1, the indexer hand 41 and the first main transfer hand 61 may have a mutually meshed shape such that they do not overlap each other in plan view and that thus interference when the substrate W is received and delivered between the indexer robot IR and the first main transfer robot CR1 is prevented.

Likewise, the substrate W may be arranged to directly received and delivered between the first main transfer robot CR1 and the second main transfer robot CR2. In this case, the reception and delivery of the substrate W is performed in the reception/delivery region A2.

For each of the processing portions 11 to 13, the pair thereof is not always needed to be provided, and at least any one of the processing portions 11 to 13 may be arranged only on one side of the transfer path 6.

The indexer robot IR may include a plurality of indexer hands 41. The indexer hands 41 may be spaced in the Z direction and may be moved independently of each other. In this case, the indexer robot IR may be arranged such that while carrying the unprocessed substrate W from the container 4, the indexer robot IR can carry the processed substrate W into another container 4. The indexer robot IR may also be arranged such that while receiving the processed substrate W from the first placement unit 31, the indexer robot IR can place the unprocessed substrate W on the first placement unit 31.

Likewise, the first main transfer robot CR1 may include a plurality of first main transfer hands 61. The first main transfer hands 61 may be spaced in the Z direction. In this case, the first main transfer robot CR1 may be arranged such that while receiving the processed substrate W from the second placement unit 32 or the first processing portion 11, the first main transfer robot CR1 can place the unprocessed substrate W on the second placement unit 32 or the first processing portion 11. The first main transfer robot CR1 may also be arranged such that while receiving the unprocessed substrate W from the first placement unit 31, the first main transfer robot CR1 can place the processed substrate W on the first placement unit 31.

Likewise, the second main transfer robot CR2 may include a plurality of second main transfer hands 81, and may be arranged such that the second main transfer robot CR2 can carry the substrates W into and out of the second processing portion 12 and the third processing portion 13 at a time or may be arranged such that the second main transfer robot CR2 can place and receive the substrates W on and from the second placement unit 32 at a time.

Various other modifications can be performed in the scope of claims.

In the configuration in which as in the first preferred embodiment, the processing portions 11 to 13 are arranged so as to be aligned in a direction (X direction) away from the holding unit 5, the following effects are also produced.

The first main transfer robot CR1 carries the substrate W into and out of the first processing portion 11 through the first exit/entrance port 11A. The second main transfer robot CR2 carries the substrate W into and out of the second processing portion 12 through the second exit/entrance port 12A and also carries the substrate W into and out of the third processing portion 13 through the third exit/entrance port 13A. Hence, as compared with the configuration in which one transfer robot which carries the substrate W into and out of the processing portions 11 to 13 is provided for each thereof, the number of transfer robots can be reduced. The number of times the substrate W is received and delivered between the indexer robot IR, the first main transfer robot CR1 and the second main transfer robot CR2 is reduced, and thus it is possible to enhance the transfer efficiency.

As described above, in the configuration in which the three processing portions 11 to 13 are arranged so as to be aligned in the X direction, while the substrate W is highly efficiently transferred, the number of transfer robots can be reduced.

The first main transfer robot CR1 and the second main transfer robot CR2 are arranged between the first processing portion 11 and the third processing portion 13. Hence, the first main transfer robot CR1 can easily access the first processing portion 11. The second main transfer robot CR2 can also easily access the second processing portion 12 and the third processing portion 13. It is also possible to design a layout in which the first main transfer robot CR1 can easily receive and deliver the substrate W from and to the second main transfer robot CR2.

The second exit/entrance port 12A is located on the side opposite to the side of the holding units 5 with respect to the center of the second processing portion 12 in the X direction. Hence, the second main transfer robot CR2 can easily access the second exit/entrance port 12A. Thus, the second main transfer robot CR2 can highly efficiently carry the substrate W into and out of the second processing portion 12.

Since the first main transfer robot CR1 is arranged opposite the first exit/entrance port 11A, the first main transfer robot CR1 can easily carry the substrate W into and out of the first processing portion 11. Hence, the first main transfer robot CR1 can highly efficiently carry the substrate W into and out of the first processing portion 11. The second main transfer robot CR2 is arranged opposite the second exit/entrance port 12A and the third exit/entrance port 13A. Hence, the second main transfer robot CR2 can easily carry the substrate W into and out of the second processing portion 12 and the third processing portion 13. Thus, the second main transfer robot CR2 can highly efficiently carry the substrate W into and out of the second processing portion 12 and the third processing portion 13.

Since the substrate W can be placed on the second placement unit 32 so that the substrate W is received and delivered between the first main transfer robot CR1 and the second main transfer robot CR2, it is not necessary to synchronize the timing at which the first main transfer robot CR1 and the second main transfer robot CR2 access the second placement unit 32 in order to receive and deliver the substrate W. Thus, the degree of freedom of the operation of the first main transfer robot CR1 and the second main transfer robot CR2 is increased. Therefore, it is possible to enhance the transfer efficiency of the substrate W by the first main transfer robot CR1 and the second main transfer robot CR2. Consequently, it is possible to enhance the transfer efficiency of the substrate W in the substrate processing apparatus 1.

The first placement unit 31 is located between the indexer robot IR and the first main transfer robot CR1. Hence, it is possible to shorten a distance over which the indexer robot IR and the first main transfer robot CR1 are moved when the substrate W is received and delivered between the indexer robot IR and the first main transfer robot CR1. Consequently, it is possible to enhance the transfer efficiency of the substrate W.

The first main transfer robot raising/lowering unit 73 is located between the indexer robot IR and the first main transfer robot CR1. Hence, as compared with the case where the first main transfer robot raising/lowering unit 73 is located on the side of the first main transfer robot CR1 opposite to the indexer robot IR, the function of raising and lowering the first main transfer robot CR1 can be provided without the arrangement of the second main transfer robot CR2 being affected. In this way, the degree of freedom of the arrangement of the second main transfer robot CR2 is increased. Consequently, it is possible to easily perform a design for reducing the size of the substrate processing apparatus 1 and maximizing the transfer efficiency of the substrate W.

The second placement unit 32 is located between the first main transfer robot CR1 and the second main transfer robot CR2. Hence, it is possible to shorten a distance over which the first main transfer robot CR1 and the second main transfer robot CR2 are moved so that the substrate W is received and delivered between the first main transfer robot CR1 and the second main transfer robot CR2. Consequently, it is possible to enhance the transfer efficiency of the substrate W.

In each of the processing blocks 21 to 23, the pairs of processing portions 11 to 13 are opposite each other across the transfer path 6. Thus, it is possible to increase the number of processing portions 11 to 13 into and out of which the first main transfer robot CR1 and the second main transfer robot CR2 carry the substrate W.

While preferred embodiments of the present invention have been described in detail above, these are simply specific examples used to clarify the technical contents of the present invention, the present invention should not be interpreted as being limited to these specific examples and the scope of the present invention shall be limited only by the appended claims.

The present application corresponds to Japanese Patent Application No. 2016-45827 filed in the Japan Patent Office on Mar. 9, 2016, and the entire disclosure of this application is incorporated herein by reference.

What is claimed is:

1. A substrate processing apparatus comprising:

an indexer section which holds a container that contains a substrate;

a processing section including a plurality of processing units each including a processing chamber in which the substrate is processed;

a transfer path along which the substrate is conveyed as it is transferred between the container held by the indexer section and the plurality of processing units, the transfer path extending to pass by a lateral side of each of the plurality of processing units, and the plurality of processing units are arranged on both sides of the transfer path so as to face one another across the transfer path;

a reception/delivery region arranged within the transfer path;

a first transfer robot, located in the indexer section, which carries the substrate into and out of the container held by the indexer section and which accesses the reception/delivery region;

a second transfer robot, located in the processing section, which receives and delivers the substrate from and to the first transfer robot via the reception/delivery region and which carries the substrate into and out of each of the plurality of processing units;

a second transfer robot raising/lowering unit which is arranged within the transfer path and which includes a drive motor that raises and lowers the second transfer robot in an up/down direction, and a rail that guides the raising and lowering of the second transfer robot in the up/down direction, and a cover which shields an atmosphere around the reception/delivery region and an atmosphere around the plurality of processing units from each other, the cover being disposed inside a perimeter of the processing section and outside a perimeter of the indexer section, wherein the reception/delivery region and the second transfer robot raising/lowering unit are both located between the first transfer robot and the second transfer robot at a region within the transfer path across which the plurality of the processing units face one another, wherein the cover is attached to at least one of the plurality of processing units and the second transfer robot raising/lowering unit such that a portion of the transfer path is blocked with the cover and the second transfer robot raising/lowering unit.

2. The substrate processing apparatus according to claim 1, wherein the transfer path is extended linearly from the indexer section toward the second transfer robot in a first horizontal direction, and the reception/delivery region and the second transfer robot raising/lowering unit are aligned in a second horizontal direction intersecting the first horizontal direction.

3. The substrate processing apparatus according to claim 2, wherein a direction in which the substrate is moved when the substrate is delivered from the first transfer robot to the second transfer robot is inclined with respect to the first horizontal direction when viewed in plan.

4. The substrate processing apparatus according to claim 1, wherein the substrate is received and placed on the reception/delivery region so that the substrate is received and delivered between the first transfer robot and the second transfer robot via the reception/delivery region.

5. The substrate processing apparatus according to claim 4, wherein the substrate placed on the reception/delivery region is located, in the up/down direction, between the container held by the indexer section and a center of the plurality of processing units in the up/down direction.

6. The substrate processing apparatus according to claim 4, further comprising a first transfer robot raising/lowering unit which includes a drive motor that raises and lowers the first transfer robot in the up/down direction between a lower position opposite the indexer section and an upper position opposite the reception/delivery region, and a rail that guides the raising and lowering of the first transfer robot in the up/down direction, wherein the substrate placed on the reception/delivery region is located, in the up/down direction, in a center position between the lower position of the first transfer robot and a center of the plurality of processing units in the up/down direction.

7. The substrate processing apparatus according to claim 1, wherein the plurality of processing units includes a pair of processing units which are provided so as to be opposite each other across the transfer path.

8. The substrate processing apparatus according to claim 1, wherein each of the processing units includes an exit/entrance port through which the substrate is moved into and out of the processing unit on a side thereof opposite to the indexer section with respect to a center of the processing unit in a first horizontal direction in which the transfer path extends, and the second transfer robot is arranged to oppose the exit/entrance port of the processing unit.

9. The substrate processing apparatus according to claim 1, wherein the plurality of processing units includes at least two processing units which are arranged in a first horizontal direction in which the transfer path extends, and the second transfer robot carries the substrate into and out of each of the at least two processing units.

10. The substrate processing apparatus according to claim 1, wherein the plurality of processing units includes three or more processing units which are arranged in a first horizontal direction in which the transfer path extends, the three or more processing units include a close processing unit arranged closest to the indexer section and a remote processing unit arranged farthest from the indexer section, the close processing unit includes an exit/entrance port through which the substrate is moved into and out of the close processing unit on a side thereof opposite to the indexer section with respect to a center of the close processing unit in the first horizontal direction, and the remote processing unit includes an exit/entrance port through which the substrate is moved into and out of the remote processing unit on a side thereof close to the indexer section with respect to a center of the remote processing unit in the first horizontal direction.

11. The substrate processing apparatus according to claim 1, wherein each of the processing units further includes a fluid box, arranged adjacent to the processing chamber, that supplies a chemical for cleaning or etching the substrate, a plurality of the processing chambers are arranged on both the sides of the transfer path so as to face one another across the transfer path, and a plurality of the fluid boxes are arranged on both the sides of the transfer path so as to face one another across the transfer path.

12. The substrate processing apparatus according to claim 11, wherein the plurality of fluid boxes includes a pair of the fluid boxes that face each other across the transfer path, and the reception/delivery region and the second transfer robot raising/lowering unit are arranged between the pair of the fluid boxes and are aligned in a direction in which the pair of the fluid boxes face each other across the transfer path.

\* \* \* \* \*